(12) United States Patent
Hafiz et al.

(10) Patent No.: US 10,355,695 B2
(45) Date of Patent: Jul. 16, 2019

(54) REPROGRAMMABLE UNIVERSAL LOGIC DEVICE BASED ON MEMS TECHNOLOGY

(71) Applicant: KING ABDULLAH UNIVERSITY OF SCIENCE AND TECHNOLOGY, Thuwal (SA)

(72) Inventors: Md Abdullah Al Hafiz, Thuwal (SA); Lakshmoji Kosuru, Thuwal (SA); Mohammad Ibrahim Younis, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 15/769,532

(22) PCT Filed: Dec. 8, 2016

(86) PCT No.: PCT/IB2016/057437
§ 371 (c)(1),
(2) Date: Apr. 19, 2018

(87) PCT Pub. No.: WO2017/098432
PCT Pub. Date: Jun. 15, 2017

(65) Prior Publication Data
US 2018/0316353 A1 Nov. 1, 2018

Related U.S. Application Data

(60) Provisional application No. 62/264,618, filed on Dec. 8, 2015.

(51) Int. Cl.
| H03K 19/02 | (2006.01) |
| H03K 19/20 | (2006.01) |
| H03K 19/21 | (2006.01) |

(52) U.S. Cl.
CPC ............. *H03K 19/02* (2013.01); *H03K 19/20* (2013.01); *H03K 19/21* (2013.01)

(58) Field of Classification Search
None
See application file for complete search history.

(56) References Cited

PUBLICATIONS

I. Mahboob, et. al, "Interconnect-free parallel logic circuits in a single mechanical resonator", Nature Communications, Feb. 15, 2011, vol. 2 (Year: 2011).*

(Continued)

*Primary Examiner* — Seokjin Kim
(74) *Attorney, Agent, or Firm* — Patent Portfolio Builders PLLC

(57) ABSTRACT

Various examples of reprogrammable universal logic devices are provided. In one example, the device can include a tunable AC input to an oscillator/resonator; a first logic input and a second logic input to the oscillator/resonator, the first and second logic inputs provided by separate DC voltage sources (VA, VB), each of the first and second logic inputs including an on/off switch (A, B); and the oscillator/resonator including an output terminal. The tunable oscillator/resonator can be a MEMS/NEMS resonator. Switching of one or both of the first or second logic inputs on or off in association with the tuning of the AC input can provide logic gate operation. The device can easily be extended to a 3-bit or n-bit device by providing additional logic inputs. Binary comparators and encoders can be implemented using a plurality of oscillators/resonators.

20 Claims, 19 Drawing Sheets

(56) References Cited

PUBLICATIONS

Rahman, M. S. et al. Device-level vacuum packaging for RF MEMS. J. Microelectromech. Syst. 19, 911-918 (2010) (Year: 2010).*

Guerra, D.N., et al., "A Noise-Assisted Reprogrammable Nanomechanical Logic Gate," Nano Letters, Apr. 14, 2010 vol. 10, No. 4, pp. 1168-1171.

International Search Report in related International Application No. PCT/IB2016/057437, dated Feb. 24, 2017.

Mahboob, I., et al., "Interconnect-Free Parallel Logic Circuits in a Single Mechanical Resonator," Nature Communications, Feb. 15, 2011, vol. 2.

Sui, B., et al., "Reconfigurable Logic Gate Implemented by Suspended-Gate Single-Electron Transistors," Proceedings of the 2010 5th IEEE International Conference on Nano/Micro Engineered and Molecular Systems, Jan. 20-23, 2010, Xiamen, China, pp. 26-29.

Written Opinion of the International Searching Authority in related International Application No. PCT/IB2016/057437, dated Feb. 24, 2017.

Badzey, R. L., et al., "A Controllable Nanomechanical Memory Element," Applied Physics Letters, Oct. 18, 2004, vol. 85, No. 16, pp. 3587-3589.

Charlot, B., et al., "Bistable Nanowire for Micromechanical Memory," Journal of Micromechanics and Microengineering, Feb. 22, 2008, vol. 18, pp. 1-7.

Guerra, D. N., et al., "Electrostatically Actuated Silicon-Based Nanomechanical Switch at Room Temperature," Applied Physics Letters, 2008, vol. 93, pp 033515-1-033515-3.

Halg, B., "On a Micro-Electro-Mechanical Nonvolatile Memory Cell," IEEE Transactions on Electron Devices, Oct. 1990, vol. 37, No. 10, pp. 2230-2236.

Hatanaka, D., et al., "An Electromechanical Membrane Resonator," Applied Physics Letters, Aug. 6, 2012, vol. 101, pp. 063120-1-603102-5.

Lee, J.E., et al., "Parasitic Feedthrough Cancellation Techniques for Enhanced Electrical Characterization of Electrostatic Microresonators," Sensors and Actuators A: Physical, Feb. 28, 2009, vol. 156, pp. 36-42.

Mahboob, I., et al., "A Multimode Electromechanical Parametric Resonator Array, "Scientific Reports, Mar. 24, 2014, vol. 4, pp. 1-8.

Mahboob, I., et al., "Bit Storage and Bit Flip Operations in an Electromechanical Oscillator," Nature Nanotechnology, May 2008, vol. 3, pp. 275-279.

Masmanidis, S.C., et al. "Multifunctional Nanomechanical Systems Via Tunably Coupled Piezoelectric Actuation," Science, Aug. 10, 2007, vol. 317, pp. 780-783.

Noh, H., et al., "A Mechanical Memory with a DC Modulation of Nonlinear Resonance," Applied Physics Letters, Jul. 23, 2010, vol. 97, 033116-1-033116-3.

Roodenburg, D., et al., "Buckling Beam Micromechanical Memory with On-Chip Readout," Applied Physics Letters, May 2009, vol. 94, pp. 183501-1-183501-3.

Swade, D. D., Redeeming Charles Babbage's Mechanical Computer, Scientific American, Feb. 1993, vol. 268, pp. 86-91.

Theis, T. N., Basic Research in the Information Technology Industry, Physics Today, Jul. 2003, vol. 56, pp. 44-49.

Uranga, A., et al., "Exploitation of Non-Linearities in CMOS-NEMS Electrostatic Resonators for Mechanical Memories," Sensors and Actuators A: Physical, Apr. 8, 2013, vol. 197, pp. 88-95.

Venstra, W. J., et al., "Mechanical Stiffening, Bistability, and Bit Operations in a Microcantilever," Applied Physics Letters, Nov. 11, 2010, vol. 97, pp. 193107-1 193107-3.

Yao, A., et al, "Logic-Memory Device of a Mechanical Resonator," Applied Physics Letters, Sep. 22, 2014, vol. 105, pp. 123104-1-123104-4.

Yao, A., et al., "Counter Operation in Nonlinear Micro-Electro-Mechanical Resonators," Physics Letters A, Aug. 1, 2013, vol. 377, pp. 2551-2555.

* cited by examiner

| NOR gate Truth Table (AC signal frequency, $f_{1S}$) |||
|---|---|---|
| Logic input A | Logic input B | Logic output |
| 0 | 0 | 1 (High) |
| 0 | 1 | 0 (Low) |
| 1 | 0 | 0 (Low) |
| 1 | 1 | 0 (Low) |

| NAND gate Truth Table (AC signal frequency, $f_{2P}$) |||
|---|---|---|
| Logic input A | Logic input B | Logic output |
| 0 | 0 | 1 (High) |
| 0 | 1 | 1 (High) |
| 1 | 0 | 1 (High) |
| 1 | 1 | 0 (Low) |

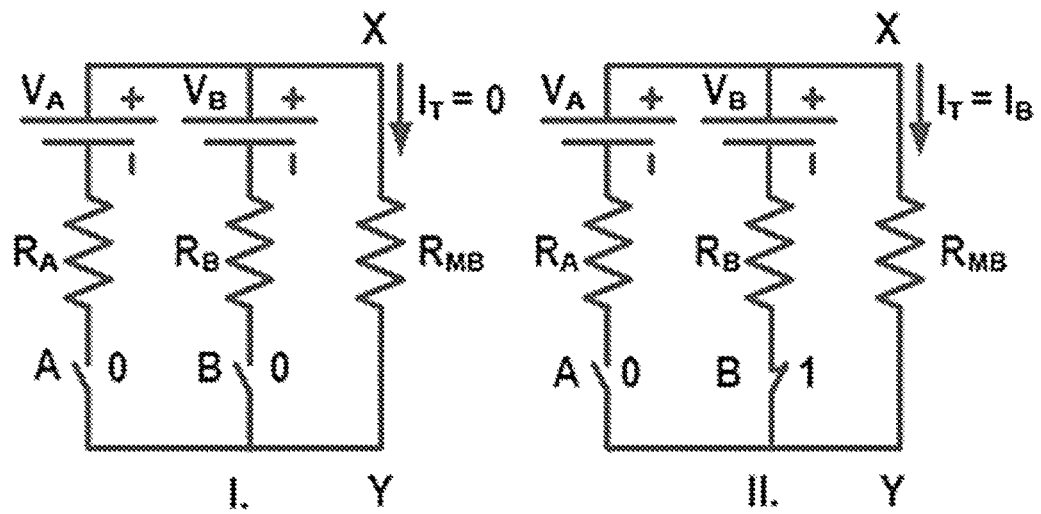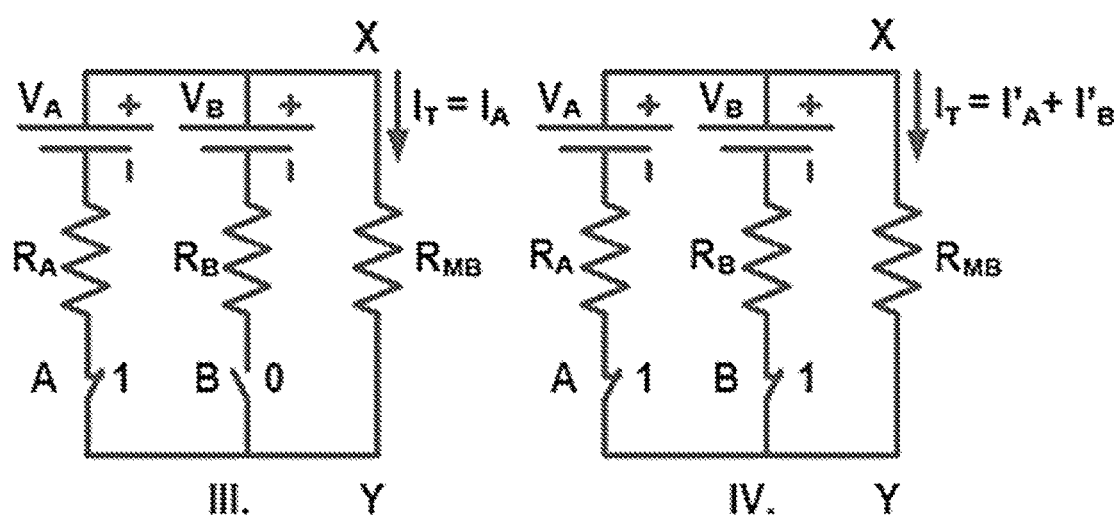
FIG. 2B

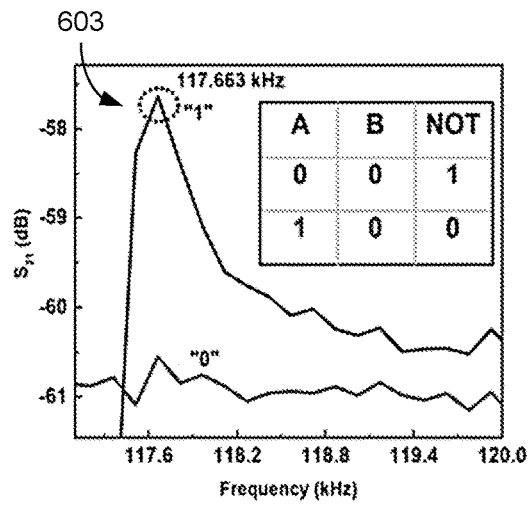
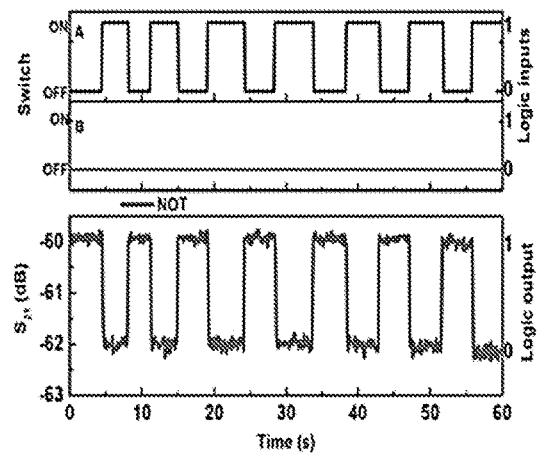
FIG. 6A  FIG. 6B
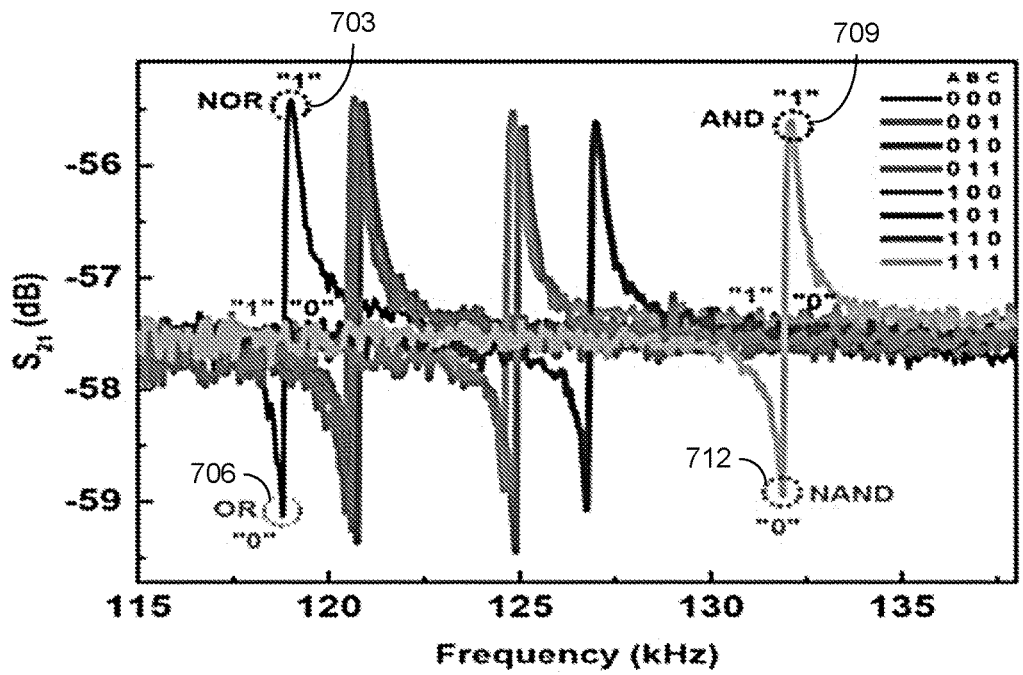
FIG. 7A

| Inputs | | Outputs | | |
|---|---|---|---|---|
| A | B | Out 1 ($S_{21}$) A>B | Out 2 ($S_{21}$) A=B | Out 3 ($S_{21}$) A<B |
| 0 | 0 | 0 (-90 dB) | 1 (-65 dB) | 0 (-90 dB) |
| 0 | 1 | 0 (-90 dB) | 0 (-85 dB) | 1 (-78 dB) |
| 1 | 0 | 1 (-78 dB) | 0 (-85 dB) | 0 (-90 dB) |
| 1 | 1 | 0 (-90 dB) | 1 (-68 dB) | 0 (-90 dB) |
FIG. 13
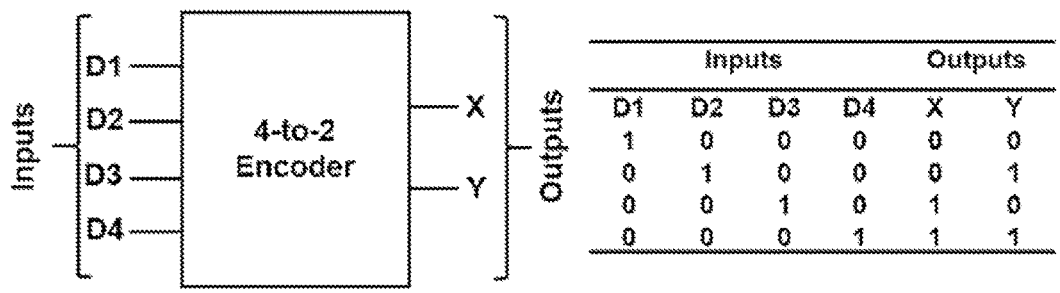
FIG. 14A
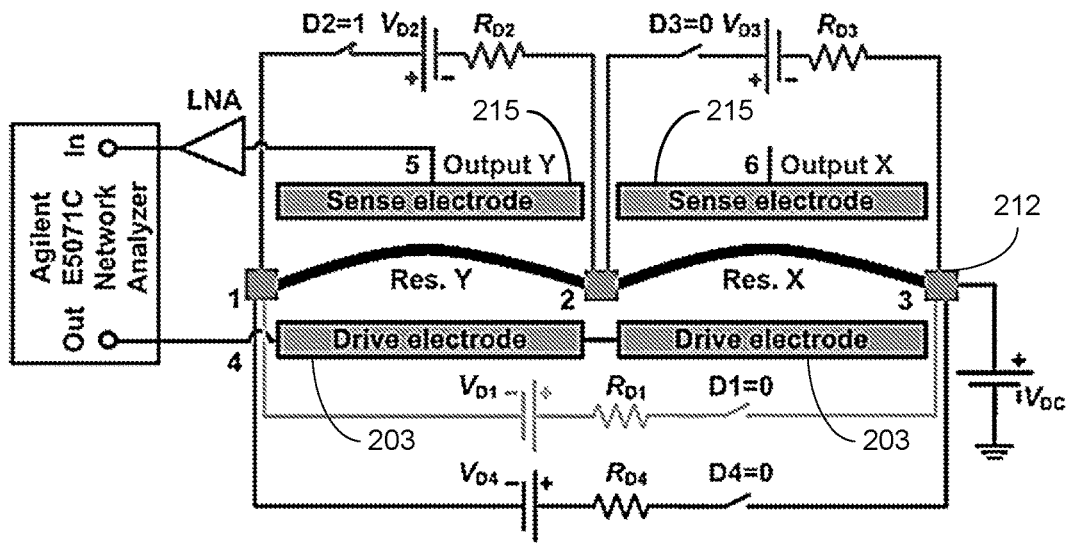
FIG. 14B

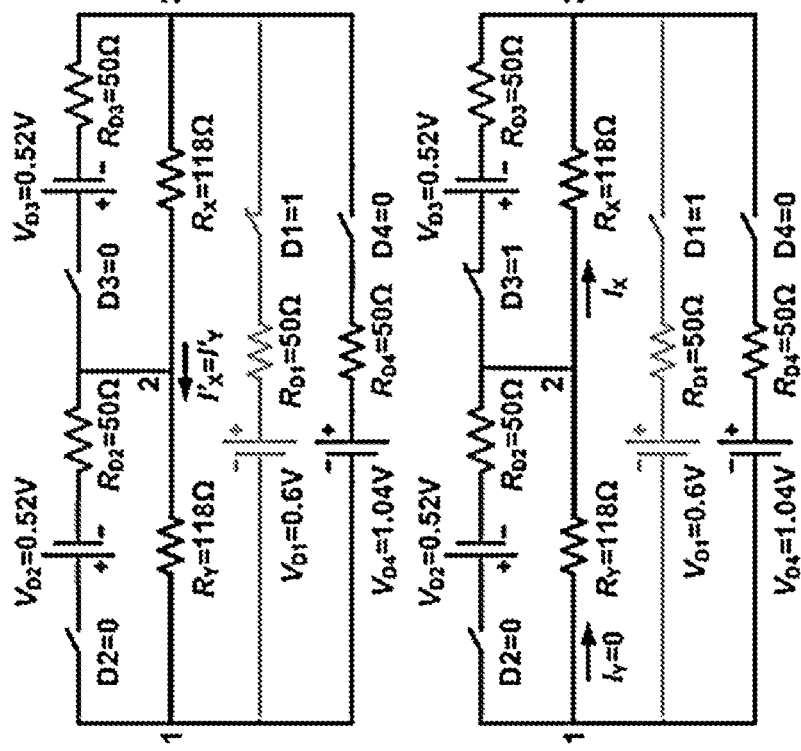

| Inputs | | | | Outputs | |
|---|---|---|---|---|---|
| D1 | D2 | D3 | D4 | X ($S_{21}$) | Y ($S_{21}$) |
| 1 | 0 | 0 | 0 | 0 (-88 dB) | 0 (-82 dB) |
| 0 | 1 | 0 | 0 | 0 (-88 dB) | 1 (-68 dB) |
| 0 | 0 | 1 | 0 | 1 (-70 dB) | 0 (-82 dB) |
| 0 | 0 | 0 | 1 | 1 (-66 dB) | 1 (-72 dB) |

FIG. 18

REPROGRAMMABLE UNIVERSAL LOGIC DEVICE BASED ON MEMS TECHNOLOGY

CROSS REFERENCE TO RELATED APPLICATIONS

This application is a U.S. National Stage Application of International Application No. PCT/IB2016/057437, which claims priority to, and the benefit of, U.S. provisional application entitled "Reprogrammable Universal Logic Device Based on MEMS Technology" having Ser. No. 62/264,618, filed Dec. 8, 2015, which are hereby incorporated by reference in their entirety.

TECHNICAL FIELD

The present disclosure generally relates to mechanical computing devices capable of performing logic gate operations.

BACKGROUND

Logic operation in current state of the art CMOS based and MEMS static switch based technologies requires different interconnect schemes between the individual elements. It restricts integration densities, gives rise to huge power consumption, and limits processing speeds. Thus, a universal device capable of performing all the fundamental logic gates operation without interconnects between different elements is highly desirable.

SUMMARY

Embodiments of the present disclosure are related to reprogrammable universal logic devices. In one embodiment, among others, a device is based on a single microelectromechanical resonator capable of performing all the fundamental 2-bit logic gate functions, such as AND/NAND, OR/NOR, XOR/XNOR, and NOT. The same device can be utilized to construct a reprogrammable 3-bit device providing AND, NAND, OR, and NOR logic gates. This device can be modified to extend its operation to an n-bit device providing AND, NAND, OR, and NOR logic gates. The device can operate in the linear regime. In one or more aspects of these embodiments, the device can comprise an in-plane arch shaped clamped-clamped highly doped silicon micro-beam. The device can be actuated and detected electrostatically. The logic operations can be performed by electro-thermal frequency modulation of the resonator operating in the linear regime where two separate DC voltage sources represent two operands of the logical operation. The device can be programmed to perform any of these logic operations by simply tuning the AC driving frequency. This reprogrammable "Universal Logic Device" of the present disclosure can operate at room temperature and under modest vacuum (pressure) conditions, e.g., 1 Torr to 10 Torr. It is suitable for CMOS compatible mass fabrication and can provide alternative mechanical computation schemes.

In another embodiment, a reprogrammable logic device comprises an oscillator/resonator, including a tunable AC input to the oscillator/resonator; a first logic input and a second logic input to the oscillator/resonator; and the oscillator/resonator including an output terminal. The first and second logic inputs can be provided by separate DC voltage sources. Each of the first and second logic inputs can include an on/off switch. In any one or more aspects of these embodiments, actuation of the oscillator/resonator can be selected from the group of electro-thermal, electrostatic, and photo-thermal actuation. The device can have series and parallel resonance peaks as measured at the output terminal, and switching at least one of the first and second logic inputs on or off can cause a shift in a series resonance peak or a shift in a parallel resonance peak or both. The switching of one or both of the first and second logic inputs on or off can provide logic gate operation. The tunable oscillator/resonator of the device can be a clamped-clamped arch-shaped beam device or a clamped-clamped straight beam device. The tunable oscillator/resonator of the device can be a MEMS/NEMS resonator. The switching of one or both of the first and second logic inputs on or off can provide AND, NAND, OR, NOR, XOR, XNOR or NOT gate logic, or any combination thereof.

In another embodiment, a method of providing logic gate operation is provided. The method can comprise providing a tunable oscillator/resonator, the oscillator/resonator including a tunable AC input, a first logic input and a second logic input each of the first and second logic inputs including an on/off switch, and an output terminal; and switching at least one of the first and second logic inputs on or off, wherein switching one or both of the first and second inputs on or off provides logic gate operation. In any one or more aspects of these embodiments, the method can include choosing an AC driving frequency in association with the switching of at least one of the logic inputs on or off. The tunable oscillator/resonator can have series and parallel resonance peaks as measured at the output terminal, whereby switching at least one of the first and second logic inputs on or off can cause a shift in a series resonance peak or a shift in a parallel resonance peak or both. The first and second logic inputs can be provided by separate DC voltage sources, either the voltage level of the first logic input or the second logic input, or both, selected to cause the shift in the series resonance peak or the parallel resonance peak or both. The tunable oscillator/resonator can be a clamped-clamped arch-shaped beam device or a clamped-clamped straight beam device. The tunable oscillator/resonator can be a MEMS/NEMS resonator. The switching of one or both of the first and second logic inputs on or off can provide AND, NAND, OR. NOR, XOR, XNOR, or NOT gate logic, or any combination thereof.

In other embodiments, binary comparators or single-bit encoders can be implemented using a plurality of tunable oscillators/resonators. A tunable AC input and logic inputs including on/off switches can be used to provide logic outputs from the comparator or encoder based on the input settings.

In any one or more aspects of any one or more of the embodiments, the oscillator/resonator can include a third logic input provided to the oscillator/resonator by a DC voltage source separate from both of the first and second logic inputs, the third logic switch including an on/off switch, thereby providing a 3-bit reprogrammable logic device for use in the method. The switching of the three logic inputs on or off can provide AND, NAND, OR or NOR gate logic, or any combination thereof. The method can further provide n-bit gate logic by adding to the oscillator/resonator additional logic inputs each provided by a separate DC voltage source and each logic input including an on/off switch.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 2B depicts examples of electrical circuit configurations illustrating four logic input conditions of the device of FIG. 2A, in accordance with various embodiments of the present disclosure.

FIG. 6A shows examples of frequency responses of the resonator of FIG. 2A for different logic input conditions with NOT logic outputs at 117.663 kHz shown in the truth table insert, in accordance with various embodiments of the present disclosure.

FIG. 6B illustrates a demonstration of the NOT logic operation of FIG. 6A, in accordance with various embodiments of the present disclosure.

FIG. 7A shows examples of frequency responses of the resonator for three different input logic conditions for a 3-bit logic device with NOR, AND, OR and NAND logic outputs, in accordance with various embodiments of the present disclosure.

FIG. 13 shows a truth table summarizing the outputs for the A>B (greater than), A=B (equal to), and A<B (less than) functions of FIGS. 10B, 11B and 12B, in accordance with various embodiments of the present disclosure.

FIG. 14A is a schematic illustrating the operation of a single-bit 4-to-2 encoder as shown in the truth table insert, in accordance with various embodiments of the present disclosure.

FIG. 14B is a schematic of an example of the single-bit 4-to-2 encoder of FIG. 14A realized using two electrically coupled arch microresonators, in accordance with various embodiments of the present disclosure.

FIGS. 15A-15D depict examples of electrical circuit configurations illustrating four input conditions of the encoder of FIG. 14B, in accordance with various embodiments of the present disclosure.

FIG. 18 shows a truth table summarizing the outputs for the single-bit 4-to-2 encoder of FIG. 14B, in accordance with various embodiments of the present disclosure.

DETAILED DESCRIPTION

Figure 1A:
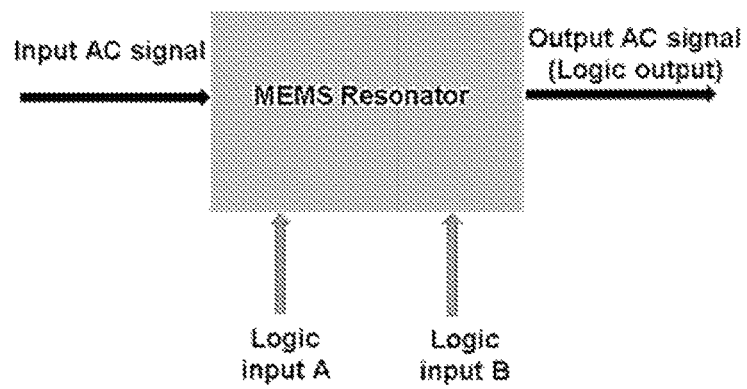
FIG. 1A is a schematic of an embodiment of the present disclosure in the form of a MEMS resonator showing an AC input terminal, two logic input (A and B) terminals and an AC output (logic output) terminal.

Described below are various embodiments of systems and methods for reprogrammable universal logic devices. Although particular embodiments are described, those embodiments are mere exemplary implementations of the systems and methods. One skilled in the art will recognize other embodiments are possible. All such embodiments are intended to fall within the scope of this disclosure. Moreover, all references cited herein are intended to be and are hereby incorporated by reference into this disclosure as if fully set forth herein. While the disclosure will now be described in reference to the above drawings, there is no intent to limit it to the embodiment or embodiments disclosed herein. On the contrary, the intent is to cover all alternatives, modifications and equivalents included within the spirit and scope of the disclosure. It is also to be understood that the terminology used herein is for the purpose of describing particular embodiments only, and is not intended to be limiting.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for.

It is to be understood that, unless otherwise indicated, the present disclosure is not limited to particular materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

The quest for mechanical computation can be traced back to at least 1822 when Babbage presented his concept of difference engine. Although interest remained within the research community, the subsequent development in the fields of electronic transistor and magnetic storage outperformed the mechanical approach in computation both in terms of speed of operation and data density. However, recent advancements in micro/nano-fabrication and measurement techniques have renewed the interest in the field of mechanical computation in the last decade. It is anticipated that mechanical computing elements will be an integral part of systems in the future, where mechanical computation would have certain advantages over its CMOS counterpart.

Important to any computing devices are logic elements. Both MEMS/NEMS switch (static) based and resonator (dynamic) based designs have been demonstrated for logic gate operations. First, demonstrated dynamic mechanical XOR logic gates were based on piezoelectric nanoelectromechanical systems (NEMS) structures, where the presence (or absence) of high amplitude vibration in the linear regime denotes a logical high (or low) state. Piezoelectric material, however, is not favorable for CMOS integration. Later, OR/NOR and AND/NAND logic gates were demonstrated utilizing the bi-stability of a nonlinearly resonating NEMS resonator mediated by the noise floor. Two other logic gates, XOR/XNOR, were not demonstrated.

A universal logic device capable of performing AND, OR and XOR logic gates as well as multibit logic circuits could be implemented by a parametrically excited single electromechanical resonator. Its operation depends on a rather complicated parametric excitation scheme with high vacuum and extremely low temperature for successful device operation. Also, the device is built on piezoelectric material which can be problematic for CMOS integration. The same research group also demonstrated XOR and OR logic gates in an electromechanical membrane resonator under high vacuum and at room temperature conditions. Recently, a memory and an OR logic operation have been shown on a nonlinear MEMS resonator based on feedback control. However, room temperature and atmospheric operation could be a prerequisite for any practical device implementation.

In the present disclosure, a reprogrammable universal logic device capable of performing a variety of logic operations is presented. In an embodiment, the device is capable of performing 2-bit AND/NAND, OR/NOR, XOR/XNOR and NOT logic gates operations. In one or more embodiments, a 3-bit AND, NAND, OR, and NOR logic gates using the same oscillator/resonator is also demonstrated. In one or more further embodiments, the device can be extended to n-bit logic operation. In one or more aspects of these embodiments, a single microelectromechanical (MEMS) or nanoelectrical mechanical (NEMS) resonator can be used. In an aspect of these embodiments, it can operate in the linear regime. The device can work under room temperature and modest vacuum conditions. It can be fabricated using standard CMOS based fabrication techniques suitable for mass fabrication and on-chip integrated system development.

In an embodiment, a resonator is provided on a highly conductive silicon (Si) device layer of a silicon on insulator (SOI) wafer by a two mask process using standard photolithography, E-beam evaporation for metal layer deposition for actuating pad, deep reactive ion etch (DRIE) for silicon device layer etching, and vapor HF etch to remove the oxide layer underneath of the resonating structure. In an aspect, the resonator can be a MEMS resonator. FIG. 1A shows a schematic illustrating a MEMS resonator and corresponding AC input terminal, logic inputs (A & B) terminals and AC output (logic output) terminal, according to the present disclosure. The MEMS resonator can be subjected to an AC signal which can cause it to vibrate. The output signal level can depend on the natural frequency of the resonator and the frequency of AC input signal. In this particular aspect, due to the standard electrostatic measurement technique employed in the measurement system, there will be a series resonance peak ($f_{1S}$) and a parallel resonance dip ($f_{1P}$) measured at the output terminal as marked in FIG. 1B. An objective of the logic inputs (A & B) is to change the resonance frequency (series and parallel) of the resonator from its as fabricated value and thus change the output terminal response accordingly. Logic operations can be performed based on that response.

Figure 1B:
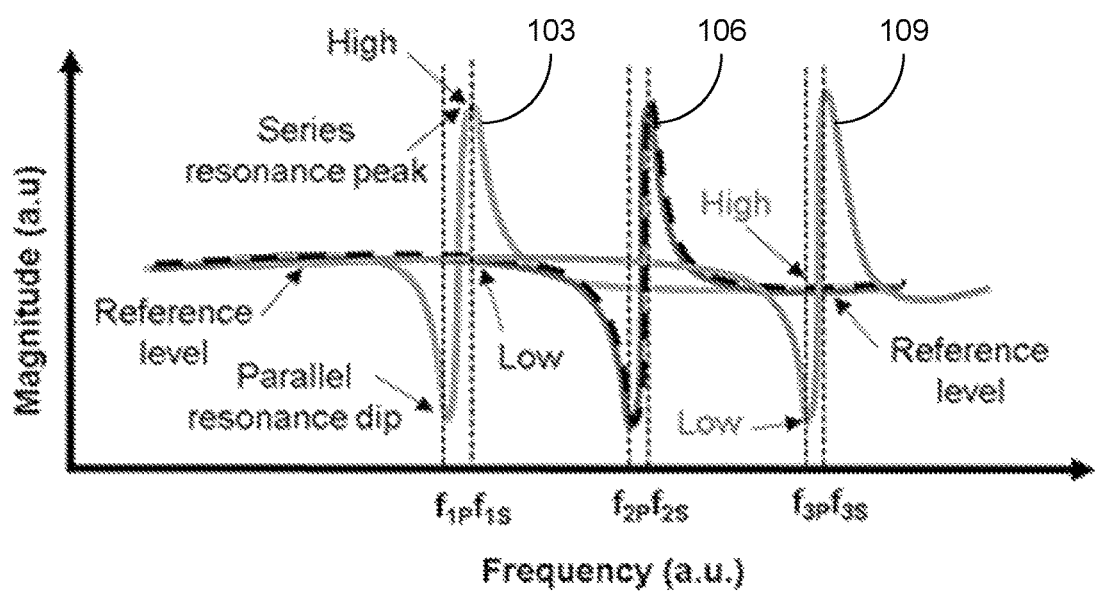
FIG. 1B shows an example of frequency response curves of the device of FIG. 1A, in accordance with various embodiments of the present disclosure.

FIG. 1B shows the frequency response of the resonator due to various logic input conditions. The curve 103 of the first peak from the left represents the response at the output terminal due to logic input condition (0,0). In this case, the series resonance peak is at $f_{1S}$ and the parallel resonance dip is at $f_{1P}$. The response curve 106 having the second peak from the left (with dashed lines) represents the logic input conditions (0,1) and (1,0), respectively, with the corresponding series resonance peak at $f_{2S}$ and parallel resonance dip at $f_{2P}$. Two separate DC voltage sources can be chosen to represent logic inputs A & B. By properly selecting voltage levels for either the (0,1) or (1,0) input conditions, the series resonance peak shifts from $f_{1S}$ to $f_{2S}$ and parallel resonance dip shifts from $f_{1P}$ to $f_{2P}$. This can be a condition to perform XOR and XNOR logic operations. The response curve 109 having the peak to the far right represents logic input condition (1,1). For this logic input condition the new series resonance peak and parallel resonance dip is at $f_{3S}$ and $f_{3P}$, respectively.

Figures 1C, 1D, 2A:
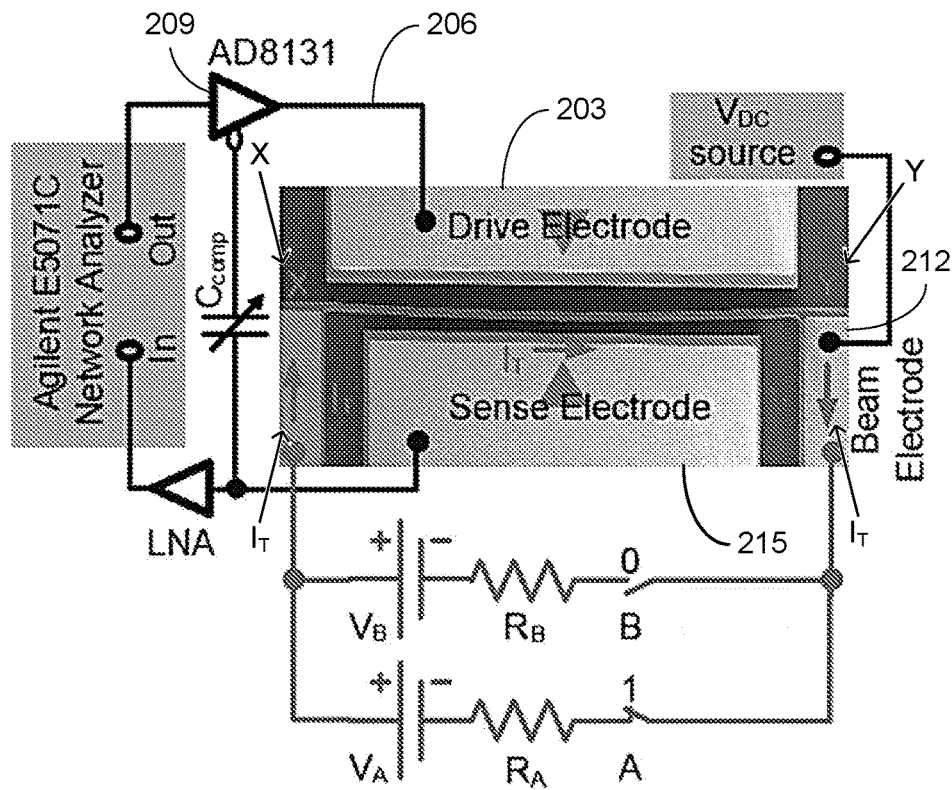
FIGS. 1C and 1D show examples of the truth tables obtained for NOR and NAND gates for different logic inputs conditions, (0,0), (0,1), (1,0), and (1,1), of the device of FIG. 1A at frequencies $f_{1S}$ and $f_{3P}$, respectively, in accordance with various embodiments of the present disclosure.
FIG. 2A shows a scanning electron microscope (SEM) image illustrating an arch beam embodiment of the present disclosure and an experimental setup of a two-port electrical transmission measurement configuration together with parasitic current compensation circuitry, in accordance with various embodiments of the present disclosure.

The series resonance peak magnitude at $f_{1S}$ can be denoted as logic output High (1) and the reference magnitude as logic output Low (0), as marked in FIG. 1B. In contrast, the parallel resonance dip magnitude at $f_{3P}$ can be denoted as logic output Low (0) and the reference magnitude as logic output High (1), as marked in FIG. 1B. NOR and NAND logic gate operations are shown at $f_{1S}$ and $f_{3P}$, respectively. Other logic gate operations can be performed based on the same principle at different frequencies. FIGS. 1C and 1D show the truth tables obtained for NOR and NAND gates for different logic inputs conditions, (0,0), (0,1), (1,0), and (1,1) of the device of FIG. 1A.

In an embodiment, the device can include a clamped-clamped arch shaped beam with two adjacent electrodes to electrostatically induce the vibration and detect the generated AC output current due to the in-plane motion of the micro-beam. In one example, among others, the dimensions of the curved beam can be 500 µm in length, 3 µm in width, and 30 µm in thickness. The gap between the actuating electrode and the resonating beam can be 8 µm at the clamped ends and 11 µm at the mid-point of the micro-beam due to its 3 µm initial curvature. While this is one example, this principle can be applicable to any range of dimensions, e.g., from micron scale to nanoscale dimensions of beams. The dimensions of the micro-beam can be adjusted to achieve other vibrational, and thus output, characteristics.

FIG. 2A shows a SEM image of the fabricated clamped-clamped arch micro-beam and the block diagram of the two-port electrical transmission measurement configuration for electrostatic actuation and sensing that includes parasitic current compensation circuit for enhanced transmission signal measurements. The drive-electrode 203 is provided with an AC signal 206 from one of the outputs from a single-to-differential driver (AD8131) 209, and the beam electrode 212 is biased with a DC voltage source.

The output current induced at the sense electrode 215 is coupled with the compensation capacitor ($C_{comp}$) and followed by a low noise amplifier (LNA) whose output is coupled to the network analyzer input port. Two logic inputs are provided with two DC voltage sources, $V_A$ and $V_B$, and switches A and B connected to the resonator in parallel across the micro-beam with series resistors, $R_A$ and $R_B$, respectively, to perform logic operations by electro-thermal tuning of resonant frequency of the beam. The arrows represent the current flow ($I_T$) through the beam. The binary logic input 1 (or 0) is represented by connecting (disconnecting) $V_A$ and $V_B$ from the electrical network by the two switches A and B, respectively. Hereafter, binary logic input 1 (or 0) corresponds to switch ON (or OFF) for each of the logic inputs. The sensing electrode 215 is used for obtaining the binary logic output where a relative high (or low) $S_{21}$ transmission signal corresponds to logical output 1 (or 0).

Electro-Thermal Frequency Modulation

Electro-thermal frequency modulation can have a role in the execution of logic functions in this architecture. FIG. 2B shows four different electrical circuit configurations between nodes X and Y of FIG. 2A, representing all the four logic input conditions, i.e. (0,0), (0,1), (1,0) and (1,1), marked in roman letters as I., II., III., and IV., respectively. Electrical circuit I represents the logic input (0,0) condition where the total current $I_T$ through the beam $R_{MB}$ is zero. Circuit II represents the logic input (0,1) corresponding to switch A being OFF and switch B being ON, where the total current $I_T$ through the beam $R_{MB}$ is $I_B$. Circuit III represents the logic input (1,0) corresponding to switch A being ON and switch B being OFF, where the total current $I_T$ through the beam $R_{MB}$ is $I_A$. Circuit IV represents the logic input (1,1) corresponding to switch A being ON and switch B being ON, where the total current $I_T$ through the beam $R_{MB}$ is $I_A'+I_B'$.

For the case of logic input condition (0,0), the total current flowing through the micro-beam is, $I_T=0$, as depicted in electrical circuit I of FIG. 2B. In this case, the resonator exhibits resonance and anti-resonance peaks at 117.663 kHz and 117.361 kHz, respectively, with an AC actuation voltage of 2 dBm and $V_{DC}$ of 45V at 1 Torr pressure and at room temperature. The corresponding frequency response 218 is plotted in the upper portion of FIG. 2C, where the (0,0) input condition, and the (0,1), (1,0) and (1,1) input conditions are shown successively from top to bottom. In this embodiment, due to over compensation of the feed-through by the parallel variable compensation capacitance, the parallel resonance peak arises earlier than the series resonance peak. However, this does not limit the successful logic operation by the device. Moreover, both the series resonance and parallel resonance peaks can be used for implementing logic gates.

For logic input conditions (0,1) or (1,0), either $V_B$ or $V_A$ can be connected to the micro-beam as depicted in electrical circuits II and III, respectively, in FIG. 2B. Hence the total current that flows through the micro-beam can be either $I_T=I_B$ or $I_T=I_A$. In an aspect, chose $V_A=0.4V$, $V_B=0.7V$ and $R_A=R_B=50\Omega$ to satisfy the condition of same current amount for each case, i.e. $I_A=I_B$. The micro-beam resistance, $R_{MB}=114\Omega$, was measured. The electrical current flowing through the micro-beam generates heat and thermal expansion that can cause an increase in the micro-beam curvature as it is clamped at both ends. Hence the linear resonance frequency of the micro-beam can increase to 121.431 kHz for either (0, 1) or (1, 0) logic input conditions. The frequency responses 221 and 224 due to logic inputs (0, 1) or (1, 0) are plotted second from the top and third from the top, respectively, in FIG. 2C.

For logic input condition (1, 1), both the voltage sources $V_A$ and $V_B$ are connected across the micro-beam as depicted in electrical circuit IV in FIG. 2B. The total current generated in this case is, $I_T=I'_A+I'_B>I_A$ or $I_B$. Hence the resonant frequency of the frequency response 227 further increases to 128.969 kHz as plotted in the lower portion of FIG. 2C.

Thus, the resonant frequency of the micro-beam can be modulated by electro-thermal effect by controlling the amount of current flowing through the micro-beam. Different logic gates can thus be built by choosing the AC driving frequency. Three regions can be identified in the frequency response plot of FIG. 2C to build all six logic gates. Region I corresponds to frequency of operation for logic gates OR/NOR, region II corresponds to logic gates XOR/XNOR, and finally, region III corresponds to logic gates AND/NAND. Detail execution of the logic gates is discussed in the following sections.

Logic Gates

NOR/OR

Figure 2C:
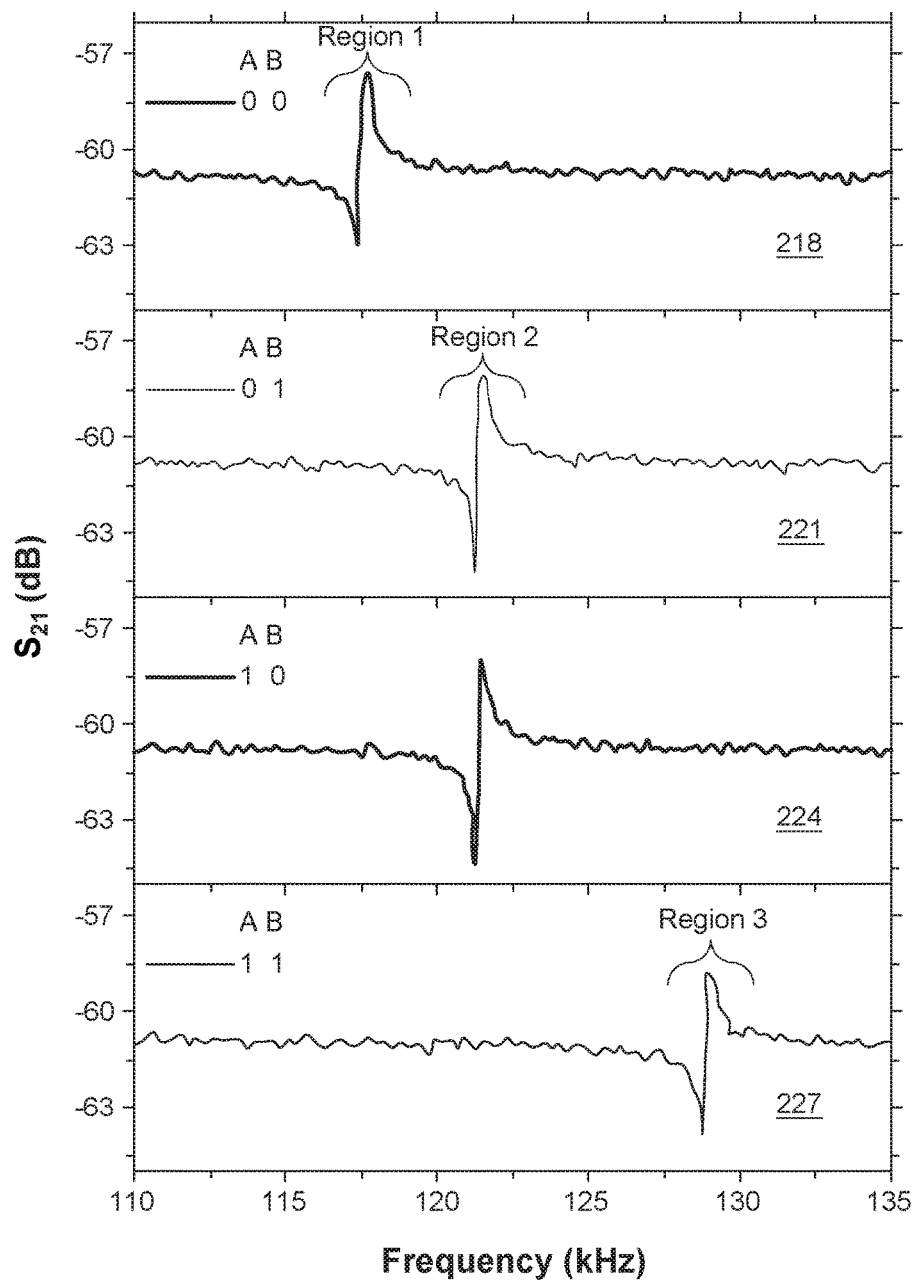
FIG. 2C shows examples of frequency responses of the resonator of FIG. 2A for the different logic input conditions of FIG. 2B, in accordance with various embodiments of the present disclosure.
Figure 3B:
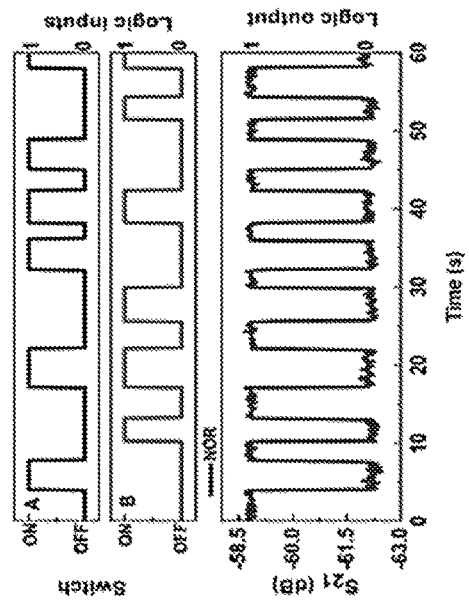
FIG. 3B illustrates a demonstration of the NOR logic operation of FIG. 3A, in accordance with various embodiments of the present disclosure.
Figure 3D:
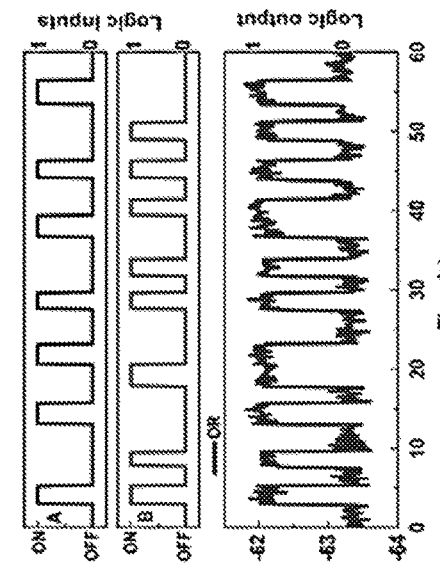
FIG. 3D illustrates a demonstration of the OR logic operation of FIG. 3C, in accordance with various embodiments of the present disclosure.
Figure 3A:
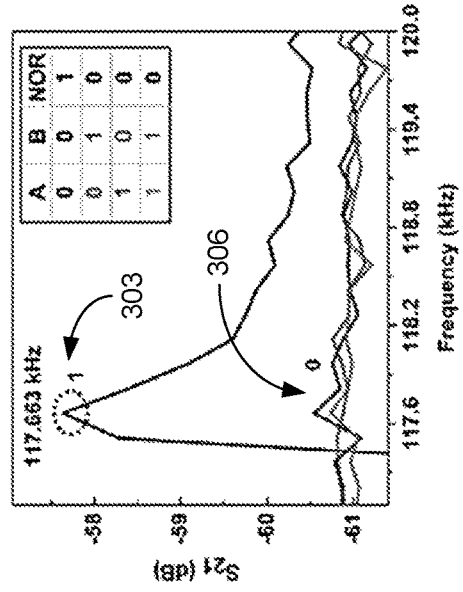
FIG. 3A shows examples of frequency responses of the resonator of FIG. 2A for different logic input conditions with NOR logic outputs at 117.663 kHz shown in the truth table insert, in accordance with various embodiments of the present disclosure.

Frequency responses of the resonator for different logic input conditions are shown in FIG. 3A which lies in region I of FIG. 2C. To demonstrate NOR gate operation, the frequency of 117.663 kHz can be chosen as it shows the high $S_{21}$ transmission signal 303 denoted as logical output 1 for the (0,0) logic input condition. For the other logic input conditions (0, 1), (1, 0) and (1, 1), respectively, it shows low $S_{21}$ transmission signals 306 denoted as logical output 0. The NOR logic gate truth table is shown in the inset of FIG. 3A where the logical output is shown in the far right column of the table. The time response of the resonator showing binary logic inputs A and B and corresponding NOR logic gate output is shown in FIG. 3B when the frequency of operation is 117.663 kHz. Two input signals A and B are shown with the input A above the input B, where the switch OFF/ON states correspond to 0/1 input conditions. It shows NOR logic gate operation as the logical response is 1 only when both the inputs A and B are 0 (switches A and B OFF), and the logical output is 0 for all other input conditions, i.e., (0,1), (1,0), and (1,1). The $S_{21}$ transmission signal corresponds to the NOR logic output and fulfills the NOR truth table.

Figure 3C:
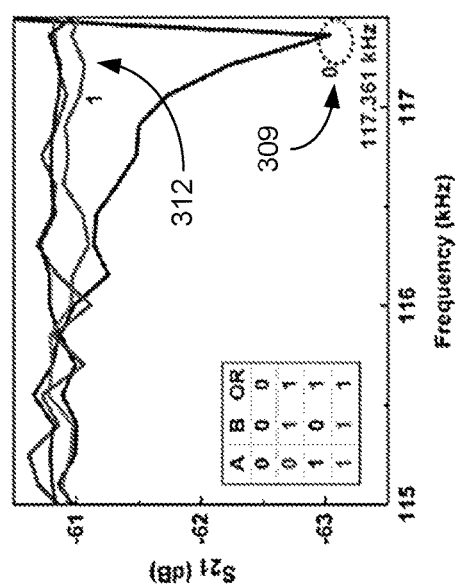
FIG. 3C shows examples of frequency responses of the resonator of FIG. 2A for different logic input conditions with OR logic outputs at 117.361 kHz shown in the truth table insert, in accordance with various embodiments of the present disclosure.

To demonstrate OR logic gate, the anti-resonance peak at 117.361 kHz shown by the dotted circle in FIG. 3C can be exploited where the (0,0) logic input condition a has low $S_{21}$ transmission signal and others have high transmission signals. Here, the low level of $S_{21}$ transmission signal 309 of anti-resonance peak is considered as logical output 0, and the transmission signals 312 otherwise as logical output 1. The OR gate logical output in the truth table is also shown in the inset of FIG. 3C in the far right column of the table. The time response of the resonator showing OR logic gate output and corresponding binary logic inputs A and B is shown in FIG. 3D when the frequency of operation is chosen to be 117.361 kHz. Two input signals A and B are shown with the input A above the input B, where the switch being OFF/ON corresponds to 0/1 input conditions. It shows OR logic gate operation as the logical output is 0 when both the inputs A and B (switches A and B OFF) are 0, and logical output is 1 for all other conditions. The $S_{21}$ transmission signal corresponds to OR logic output and fulfills the OR truth table.

XOR/XNOR

Figure 4A:
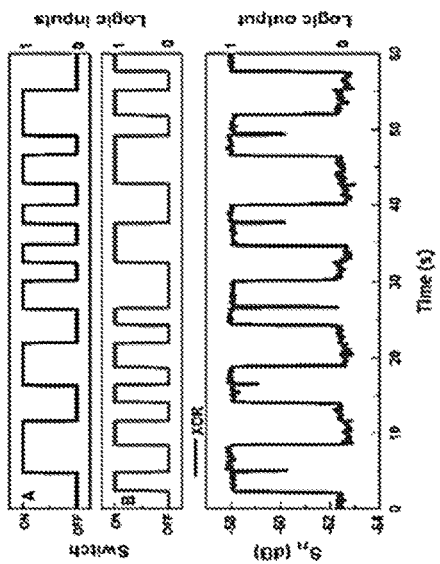
FIG. 4A shows examples of frequency responses of the resonator of FIG. 2A for different logic input conditions with XOR logic outputs at 121.431 kHz shown in the truth table insert, in accordance with various embodiments of the present disclosure.
Figure 4B:
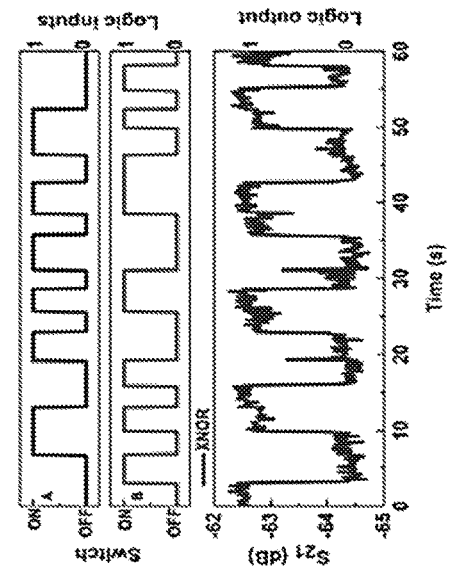
FIG. 4B illustrates a demonstration of the XOR logic operation of FIG. 4A, in accordance with various embodiments of the present disclosure.

Frequency responses of the resonator for different logic input conditions are shown in FIG. 4A which lies in region II of FIG. 2C. To implement an XOR gate, the frequency of operation can be chosen to be 121.431 kHz as shown by the dotted circle in FIG. 4A. At this operating frequency, it shows low $S_{21}$ transmission signals 403 denoted as logical output 0 for same logic inputs conditions (0,0) or (1,1). For other logic input conditions (0,1) and (1,0), it shows high $S_{21}$ transmission signals 406 denoted as logical output 1. The truth table for the XOR logic gate is shown in the inset of FIG. 4A where the logical output is shown in the far right column of the table. The time response of the resonator showing binary logic inputs A and B and corresponding XOR logic gate output is shown in FIG. 4B when the frequency of operation is chosen as 121.43 kHz. Two input signals A and B are shown with the input A above the input B, where the switch being OFF/ON corresponds to 0/1 input conditions. It shows XOR logic gate operation as the logical output is 1 when the inputs A and B are complementary to each other. On the other hand, the logical output is 0 for the same logic input conditions, i.e., (0,0) and (1,1). The $S_{21}$ transmission signal corresponds to XOR logic output and fulfills the XOR truth table.

Figure 4C:
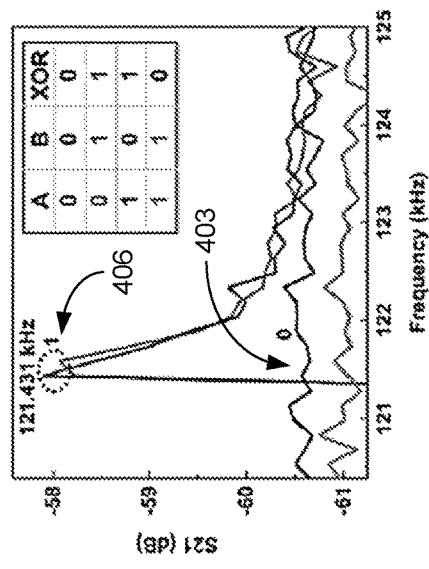
FIG. 4C shows examples of frequency responses of the resonator of FIG. 2A for different logic input conditions with XNOR logic outputs at 121.281 kHz shown in the truth table insert, in accordance with various embodiments of the present disclosure.
Figure 4D:
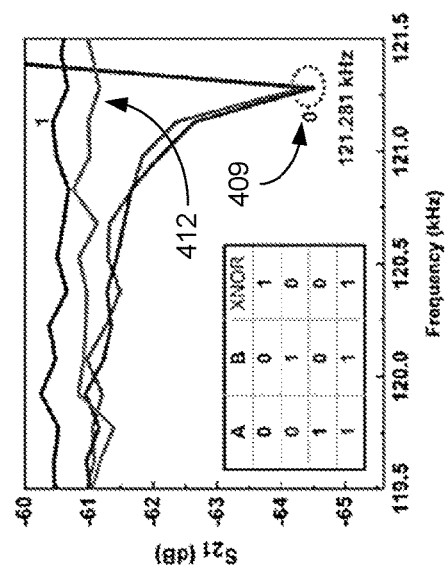
FIG. 4D illustrates a demonstration of the XNOR logic operation of FIG. 4C, in accordance with various embodiments of the present disclosure.

To demonstrate XNOR logic gate, the parallel resonance peak at 121.281 kHz shown in the dotted circle in FIG. 4C can be exploited. Here, the (0,0) and (1,1) logic input conditions have low level of $S_{21}$ transmission signals 409 considered as logical output 0, and transmission signals 412 are otherwise considered as logical output 1. XNOR gate output in the truth table is shown in the inset of FIG. 4C in the far right column of the table. FIG. 4D shows the time response of XNOR logic gate output and corresponding binary logic inputs A and B when the frequency of operation is chosen as 121.281 kHz. Two input signals A and B are shown with the input A above the input B, where the switch being OFF/ON corresponds to 0/1 input conditions. It shows XNOR logic gate operation as the logical output is 1 when both the inputs A and B are same, i.e., (0,0) and (1,1), and otherwise the logical output is 0. The $S_{21}$ transmission signal corresponds to XNOR logic output and fulfills the XNOR truth table. Note that occasional spikes observed in the $S_{21}$ transmission signals in FIG. 4B and in FIG. 4D are due to a change in the logic input conditions between (0,1) and (1,0). However, the resonator still performs the desired logic operation successfully.

AND/NAND

Figure 5A:
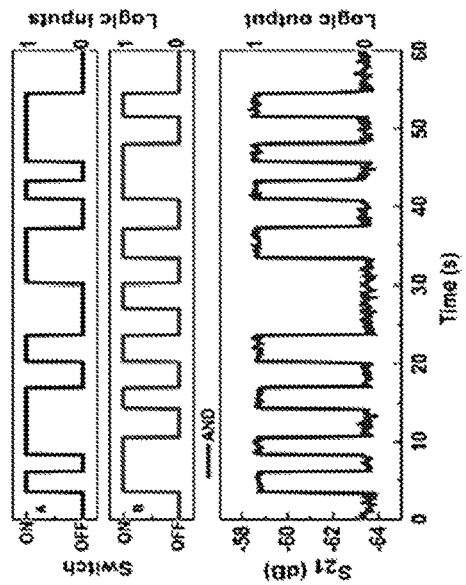
FIG. 5A shows examples of frequency responses of the resonator of FIG. 2A for different logic input conditions with AND logic outputs at 128.969 kHz shown in the truth table insert, in accordance with various embodiments of the present disclosure.
Figure 5B:
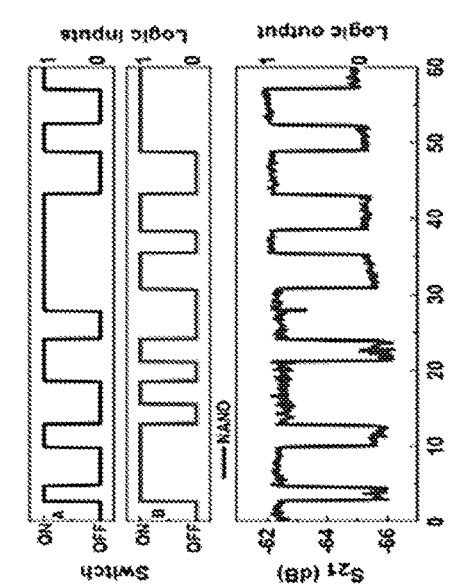
FIG. 5B illustrates a demonstration of the AND logic operation of FIG. 5A, in accordance with various embodiments of the present disclosure.

Frequency responses of the resonator for different logic input conditions are shown in FIG. 5A which falls in the region III of FIG. 2C. To demonstrate AND gate operation, the frequency of 128.969 kHz can be chosen which is shown in the dotted circle in FIG. 5A. When both inputs A and B are 1 (switches A and B are both ON), the high $S_{21}$ transmission signal 503 is observed at the operating frequency, which is denoted as output 1. For other logic input conditions, i.e., (0,1), (1,0) and (0,0), it shows the low $S_{21}$ transmission signals 506, which are denoted as output 0. This is expressed in the AND gate truth table shown in the inset in FIG. 5A in the far right column of the table. The time response of the resonator showing AND gate output and corresponding binary logic inputs A and B are shown in FIG. 5B when the frequency of operation is chosen as 128.969 kHz. Two input signals A and B are shown with the input A above the input B, where the switch being OFF/ON corresponds to 0/1 input conditions. It shows AND gate operation as the output is 1 only when the both the inputs A and B are 1, otherwise the output is 0. The $S_{21}$ signal corresponds to AND logic output and fulfills the AND truth table.

Figure 5C:
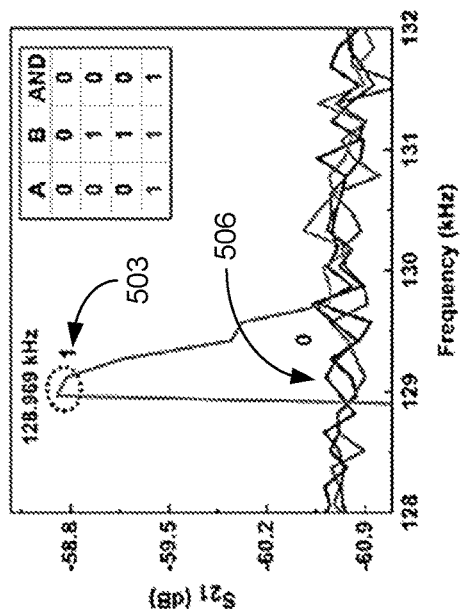
FIG. 5C shows examples of frequency responses of the resonator of FIG. 2A for different logic input conditions with NAND logic outputs at 128.819 kHz shown in the truth table insert, in accordance with various embodiments of the present disclosure.
Figure 5D:
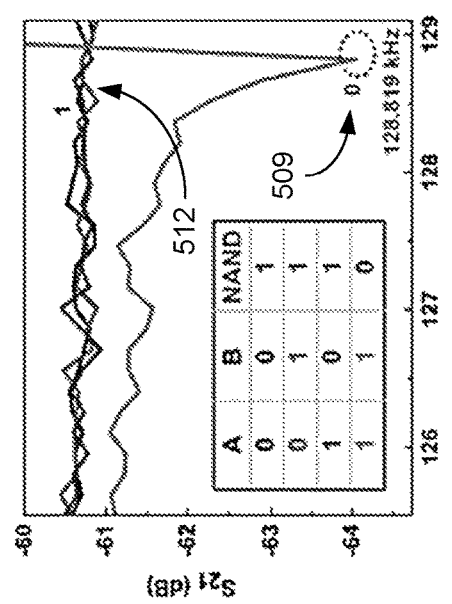
FIG. 5D illustrates a demonstration of the NAND logic operation of FIG. 5C, in accordance with various embodiments of the present disclosure.

To demonstrate operation as a NAND gate, the frequency of operation can be chosen to be 128.819 kHz as shown in the dotted circle in FIG. 5C. Here, the (1,1) logic input condition has a low level $S_{21}$ transmission signal 509 of anti-resonance peak that is considered as logical output 0, and otherwise the transmission signals 512 are considered logical output 1. NAND gate output in the truth table is shown in the inset of FIG. 5C in the far right column of the table. FIG. 5D shows the time response of NAND logic gate output and corresponding binary logic inputs A and B when the frequency of operation is chosen as 128.819 kHz. Two input signals A and B are shown with the input A above the input B, where the switch being OFF/ON corresponds to 0/1 input conditions. It shows NAND logic gate operation as the logical output is 0 only when both the inputs A and B are 1. The $S_{21}$ signal corresponds to NAND logic output and fulfills the NAND truth table.

NOT

To perform NOT operation on input A, input B can be set to 0 (switch OFF) and the AC input frequency can be chosen to be 117.663 kHz. For this (0,0) logic input condition, a high $S_{21}$ transmission signal 603 (logic output 1) can be achieved for input A set at 0 (switch OFF) and vice versa where the other logic input has a low transmission signal, as shown in FIG. 6A. Note that the NOT operation can also be built on input B by properly setting input A (switch OFF/ON) and the AC driving frequency. The truth table of NOT logic output is shown in the inset. A time response for NOT operation is shown in FIG. 6B when the frequency of the AC input signal is chosen at 117.663 kHz. Two input signals A and B are shown with the input A above the input B, where the switch being OFF/ON corresponds to 0/1 input conditions. It is evident from the output signal that when the input A is 0, the output is 1 and vice versa. The $S_{21}$ signal corresponds to NOT logic output and fulfills the NOT truth table.

3-Bit Logic Gates

Embodiments of 3-bit logic gates can also be implemented by adding a third voltage source. In an aspect a third voltage source, $V_C$ (0.44V), can be provided in parallel with $V_A$ (0.4V) and $V_B$ (0.7V) in FIG. 2A, with a series resistance $R_C$ (50Ω) and switch C connected accordingly. In an aspect of the present disclosure, NOR, OR, AND and NAND logic gates can be realized. FIG. 7A shows the frequency responses of the resonator for different input logic conditions with an AC actuation voltage of 2 dBm and $V_{DC}$ of 40V at 1 Torr pressure and at room temperature. In an aspect, a NOR gate can be realized by choosing the AC driving frequency at 119.022 kHz marked as the dotted circle 703 in the upper left area of FIG. 7A, where the (0 0 0) condition has a high $S_{21}$ transmission signal ("1") and all other transmission signals have low signal ("0"). Similar to the 2-bit OR logic operation, the 3-bit OR logic operation can be performed by choosing the frequency of the anti-resonance peak shown in the dotted circle 706 in the lower left area of FIG. 7A.

In an aspect a 3-bit AND gate can be realized by choosing the frequency of operation at 132.105 kHz marked as the dotted circle 709 in the upper right area of FIG. 7A, where only a (1 1 1) condition has a high $S_{21}$ transmission signal ("1") and all other transmission signals have low signal ("0"). By choosing the corresponding anti-resonance peak frequency, marked as the dotted circle 712 in the lower right area of FIG. 7A, a 3-bit NAND gate can be realized.

Figure 7B:
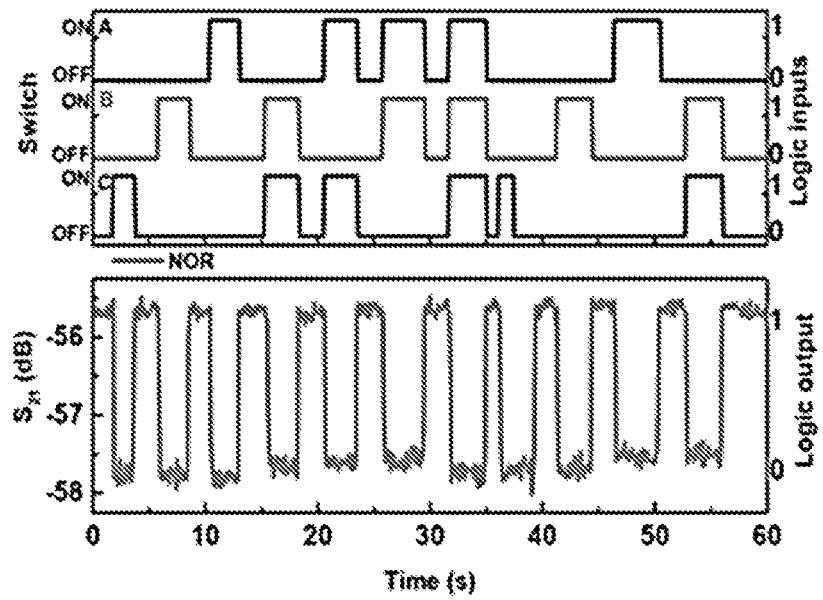
FIG. 7B illustrates a demonstration of the NOR logic operation of FIG. 7A at 119.022 kHz, in accordance with various embodiments of the present disclosure.
Figure 7C:
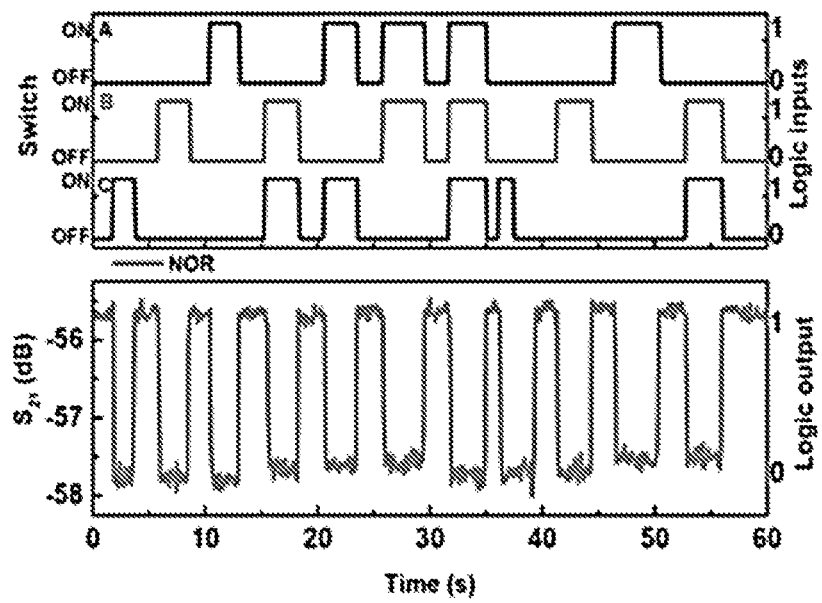
FIG. 7C illustrates a demonstration of the AND logic operation of FIG. 7A at 132.105 kHz, in accordance with various embodiments of the present disclosure.

FIG. 7B shows the time response of the 3-bit NOR logic gate at operation frequency of 119.022 kHz. Three logic input signals A, B, and C are shown one above the other, respectively, where the switch being OFF/ON corresponds to 0/1 input conditions. The $S_{21}$ transmission signal corresponds to the logic output and fulfills the NOR truth table. FIG. 7C shows a demonstration of the 3-bit AND logic operation when the frequency of operation is chosen to be 132.105 kHz. Three input signals A, B, and C are shown one above the other, respectively, where the switch being OFF/

ON corresponds to 0/1 input conditions. The $S_{21}$ transmission signal corresponds to the logic output and fulfills the AND truth table.

A universal logic device based on electro-thermal tuning of the resonator frequency, capable of performing a plurality of logic gate operations, including the logic gates AND/NAND, OR/NOR, and XOR/XNOR and NOT has been demonstrated. The device can operate at room temperature and at modest vacuum conditions.

A single MEMS resonator based reprogrammable 3-bit logic device has also been demonstrated. The reprogrammable 3-bit device can perform a plurality of logic operations, including AND, NAND, OR, and NOR logic gates. The device can easily be modified to perform n-bit logic operations, including OR/NOR and AND/NAND logic operations by simply adding one voltage source per bit in parallel in the electrical network responsible for electro-thermal frequency modulation.

In one or more aspects the device can be programmed to perform a desired logic operation by simply choosing the appropriate AC driving frequency. This simple yet efficient logic device can operate in the linear regime of the resonator and hence can further reduce voltage load if operated under vacuum conditions. Although an arch shaped micro beam is shown in connection with FIG. 2A, the same principle can be equally used on straight clamped-clamped beam MEMS/NEMS resonators to implement logic gates. Moreover, two or more such devices can be cascaded for more complex logic circuits operation. This practical demonstration of an essential element of mechanical computation can provide fundamental building blocks for alternative computing schemes in the mechanical domain.

While the fundamental 2-bit and selective n-bit logic operations on a single device have been demonstrated, to build a realistic electromechanical computing machine different functional elements such as, e.g., memory, logic gates, and complex logic circuits can be developed within a single conceptual framework. Here an alternative approach to construct complex logic circuits is demonstrated based on electrothermally tunable multiple MEMS resonators, where complex logic functions can be executed through reconfiguring the electrothermal actuation circuits. The basic concept will be demonstrated through several logic elements such as, e.g., a single-bit binary comparator and a single-bit 4-to-2 encoder. These functions can be realized based on the basic building block of electrothermally tuned linear MEMS resonators; thereby illustrating the prospect of building a single conceptual framework towards the realization of an electromechanical computer.

Binary Comparator

Figure 8A:
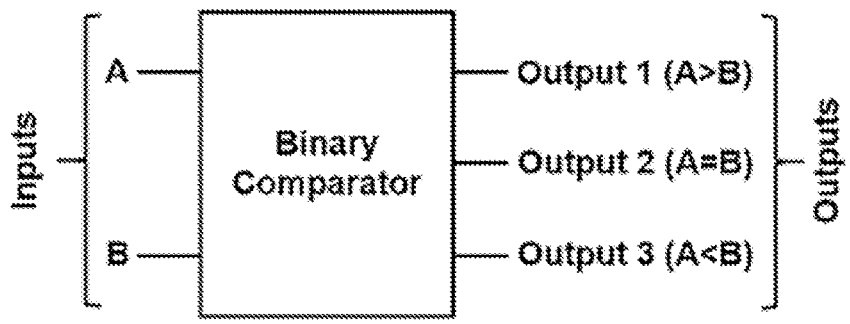
FIG. 8A is a schematic illustrating the operation of a single-bit comparator as shown in the truth table insert, in accordance with various embodiments of the present disclosure.

A binary comparator is a combinational logic circuit, which compares two binary inputs, A and B, and produces three outputs representing A=B (equality), A>B (greater than), and A<B (less than) functions. FIG. 8A shows a block diagram of a single-bit comparator with the corresponding inputs, A and B, and the three outputs, namely, output 1 (A>B), output 2 (A=B), and output 3 (A<B). The table in FIG. 8A shows the corresponding truth table of the single-bit binary comparator. Based on the input bit patterns, only one of its outputs can be high. In the subsequent sections, it will be shown how the resonator based circuit performs the desired operation of a single-bit comparator.

Figure 8B:
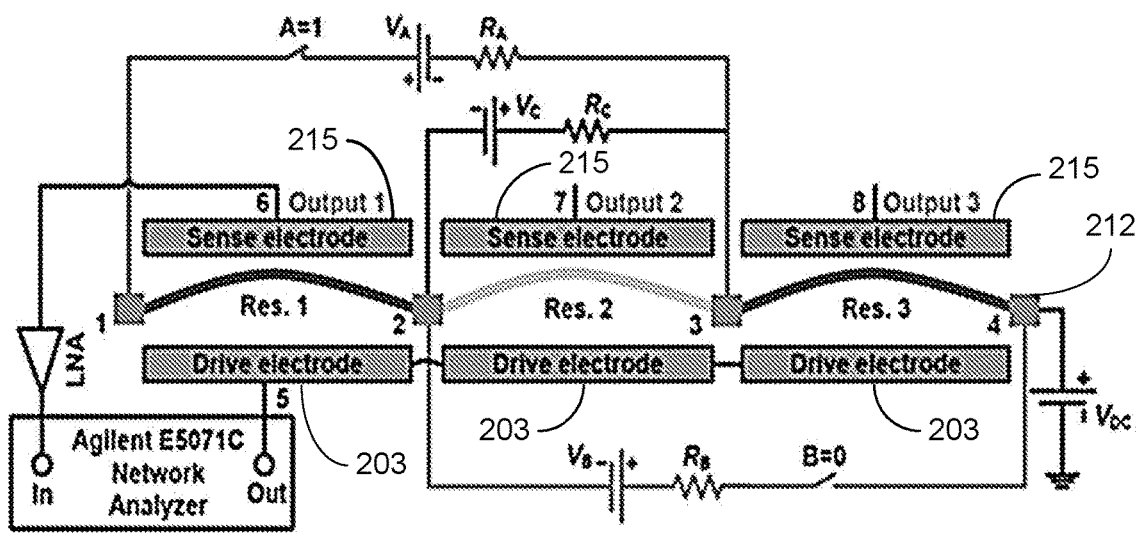
FIG. 8B is a schematic of an example of the single-bit comparator of FIG. 8A realized using three electrically coupled arch microresonators, in accordance with various embodiments of the present disclosure.

FIG. 8B shows a schematic of a setup for realizing the binary comparator using three electrically connected arch microresonators. The schematic depicts drive electrodes 203, sense electrodes 215, and the three arch micro-beam resonators (Res. 1, Res. 2 and Res. 3). Res. 1 is placed between nodes 1-2, Res. 2 is placed between nodes 2-3, and Res. 3 is placed between nodes 3-4. All the drive electrodes 203 are electrically connected and provided with the same AC drive signal from the output port of the network analyzer (Agilent E5071C) at node 5. All the micro-beams are biased with a single DC voltage source, $V_{DC}$=40V, connected at node 4. $V_A$ and $V_B$ represent two binary inputs controlled by switches A and B, respectively.

The three outputs, namely output 1 (node 6), output 2 (node 7), and output 3 (node 8), demonstrate A>B (greater than), A=B (equal to or equality), and A<B (less than) functions, respectively. The logic outputs are obtained from the three resonator sensing ports. These outputs can be connected to a low noise amplifier (LNA), one at a time, to amplify the AC current generated due to the in-plane motion of the corresponding micro-beam at resonance. The output of the LNA is coupled to the network analyzer input port for $S_{21}$ transmission signal measurement. Note that for a practical realization of the comparator, all three outputs are measured simultaneously. However, for experimental verification the outputs were discretely sensed. All the experiments have been conducted at 1 Torr pressure and at room temperature with the following preset conditions: $V_{DC}$=40V, $V_{AC}$=0 dBm (0.224$V_{rms}$), and AC operating frequency, $f_{op}$=143 kHz.

In the embodiment of FIG. 8B, three nominally identical arch resonators are used: Res. 1, Res. 2, and Res. 3 of resonance frequencies 122-124 kHz. When measuring the resistances across the anchors (or beam electrodes 212) of the individual resonators, Res. 1 and Res. 3 showed identical resistances of 115Ω, whereas Res. 2 showed 117Ω. Next, the curvature of Res. 2 was adjusted from its initial fabricated value of 3 µm by passing a DC current through it using a voltage source, $V_C$=0.7V, and a series resistance, $R_C$=50Ω, as shown in FIG. 8B. This DC current induces resistive heating, and accordingly compressive stress on the micro-beam, which increases its curvature and stiffness. As a result the resonance frequency of Res. 2 increases, which is measured around 143 kHz. This frequency (143 kHz) was used as the operating frequency for the demonstration of the comparator operation. Hence, Res. 2 will vibrate at on-resonance state at this frequency while Res. 1 and Res. 3 will be at off-resonance. This represents the case for the binary input condition (0,0). The comparator is realized because of this condition.

It is worth noting that nominally identical resonators have been used for the implementation of the comparator, and thus $V_C$ was used to set the resonance frequency of Res. 2 at a higher value compared to Res. 1 and Res. 3 to demonstrate the proof-of-concept. By intentionally fabricating Res. 2 with a higher resonance frequency compared to Res. 1 and Res. 3, one can eliminate the need for $V_C$. The use of $V_C$ actually demonstrates the flexibility of the approach for realizing the desired complex logic operations since it does not rely on perfect fabrication tolerances.

Next, the two logic inputs are provided with two separate DC voltage sources, $V_A$ (0.4V) and $V_B$ (1.3V), connected across nodes 1-3 and nodes 2-4, respectively, with the corresponding series resistances, $R_A$=50Ω and $R_B$=50Ω along with two switches, A and B, as shown in FIG. 8B. The difference in the voltage levels for inputs A and B is due to the presence of $V_C$ in the experimental setup. Otherwise, both voltage sources are expected to be nominally identical. The binary logic input 1 (or 0) is represented by connecting (or disconnecting) $V_A$ and $V_B$ from the electrical network by the two switches A and B, respectively. Hereafter, the switch ON (or OFF) condition for switches A and B corresponds to the binary logic input 1 (or 0). The sensing electrodes are used to obtain the logic outputs, where a high (or low) $S_{21}$ transmission signal at the on-resonance (or off-resonance) state corresponds to logic output 1 (or 0).

Figure 9A:
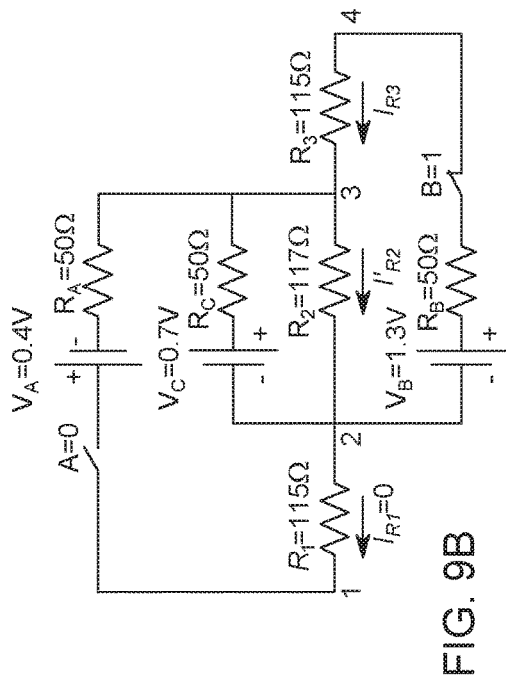
FIGS. 9A-9D depict examples of electrical circuit configurations illustrating four logic input conditions of the comparator of FIG. 8B, in accordance with various embodiments of the present disclosure.
Figure 9B:
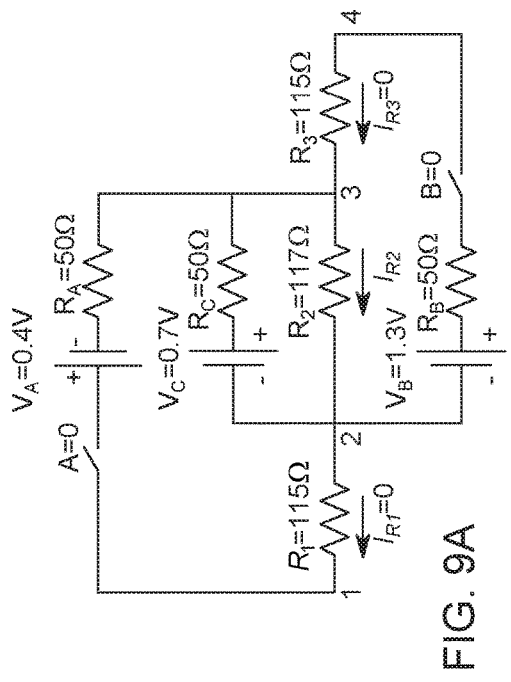
Figure 9C:
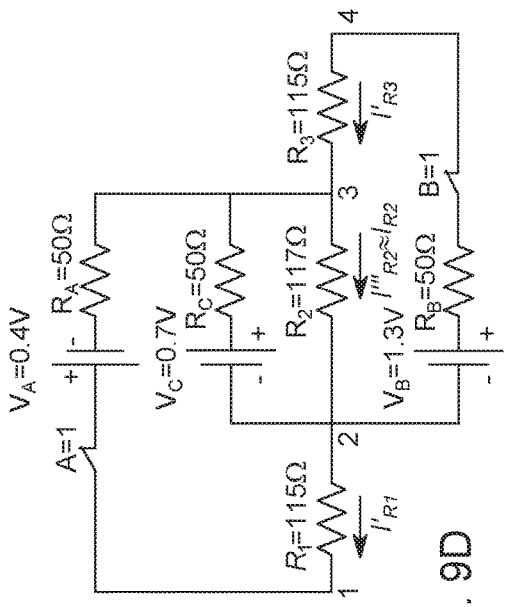
Figure 9D:
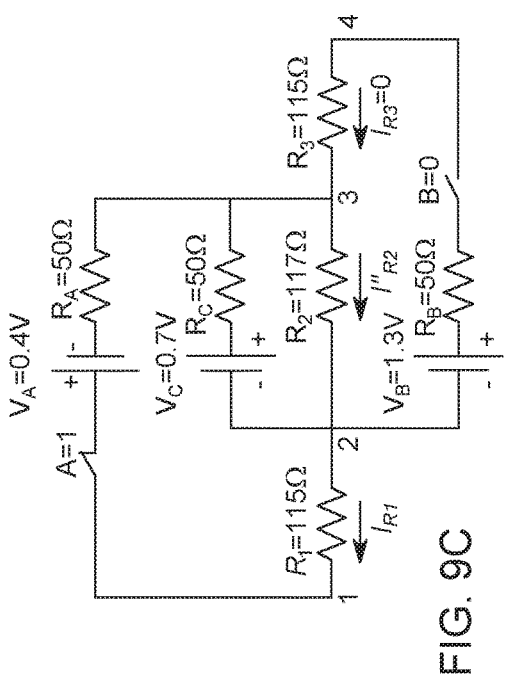

FIGS. 9A-9D show examples of the electrical circuit diagrams for the electrothermal actuation for implementing the binary comparator, which shows the corresponding DC current flow through the micro-beams at different logic input conditions. The electrical circuit of FIG. 9A represents the (0,0) logic input condition where the current flowing through Res. 1, Res. 2, and Res. 3 are $I_{R1}=0$, $I_{R2}=0$, and $I_{R3}=0$, respectively. The electrical circuit of FIG. 9B represents the (0,1) logic input condition, where the current flowing through Res. 1, Res. 2, and Res. 3 are $I_{R1}=0$, $I'_{R2}$, and $I_{R3}$, respectively. The electrical circuit of FIG. 9C represents the (1,0) logic input condition, where the current flowing through Res. 1, Res. 2, and Res. 3 are $I_{R1}$, $I''_{R2}$, and $I_{R3}=0$, respectively. The electrical circuit of FIG. 9D represents the (1,1) logic input condition, where the current flowing through Res. 1, Res. 2, and Res. 3 are $I'_{R1}$, $I'''_{R2} \approx I_{R2}$, and $I'_{R3}$, respectively.

For logic input condition, A=B=0, the currents flowing through Res. 1 and Res. 3 are zero, as shown in FIG. 9A. At the same time, the current flowing through Res. 2 is $I_{R2}$ due to the applied DC voltage, $V_C$. At $f_{op}=143$ kHz, both Res. 1 and Res. 3 are at off-resonance while Res. 2 is at on-resonance. Hence, the signal detected at output 2 is high (1) whereas the signals from output 1 and output 3 are low (0).

For logic input condition, A=0 and B=1, there is no current flow through Res. 1, but there are DC currents flowing through Res. 2 and Res. 3, as shown in FIG. 9B. The amount of current through Res. 2 is now $I'_{R2}$, which is different from $I_{R2}$. Hence, it changes the resonance frequency of Res. 2 from its initial value of 143 kHz to some other value, making it vibrating at off-resonance at $f_{op}=143$ kHz. Due to the proper choice of voltage amplitude for $V_B$ (1.3V), the current $I_{R3}$ which flows through Res. 3 shifts its resonance frequency to 143 kHz. Consequently, both Res. 1 and Res. 2 are off-resonance while Res. 3 is on-resonance. Thus, the signal from output 1 and output 2 will be low (0) and at the same time it will be high (1) from output 3.

For the logic input condition, A=1 and B=0, there is no current flow through Res. 3, but DC currents flow through Res. 1 and Res. 2, as shown in FIG. 9C. The amount of current flow through Res. 2 is now $I''_{R2} \neq I_{R2}$, which changes its resonance frequency making it vibrate at off-resonance at $f_{op}=143$ kHz. At the same time, $I_{R1}$, which flows through Res. 1 shifts its resonance frequency to 143 kHz due to the proper choice of the voltage amount ($V_A=0.4$V). This indicates that both Res. 2 and Res. 3 are off-resonance and only Res. 1 is on-resonance at $f_{op}=143$ kHz. Hence, the output from output 2 and output 3 will be low (0) and high (1) from output 1.

When A=B=1, the currents flowing through Res. 1 and Res. 3 are $I'_{R1}$ and $I'_{R3}$, respectively, which shift their corresponding resonance frequencies away from $f_{op}=143$ kHz. However, due to the polarity arrangement of the voltage sources, $V_A$ and $V_B$, the current flow through Res. 2 is $I'''_{R2} \neq I_{R2}$, as shown in FIG. 9D. The reason is that the additional currents flowing through Res. 2 due to the presence of both voltage sources ($V_A$ and $V_B$) are nominally identical in magnitude but opposite in direction, hence they cancel each other. As a result, the resonance frequency of Res. 2 remains unchanged at 143 kHz. Thus, Res. 1 and Res. 3 are off-resonance while Res. 2 is on-resonance at $f_{op}=143$ kHz. Consequently, output 1 and output 3 will show low (0) and output 2 will show high (1) $S_{21}$ transmission signal.

In the following sections, frequency response plots and time sweep data is provided for the comparator and demonstrate its successful operation.

Input A "Greater Than" Input B

Figure 10A:
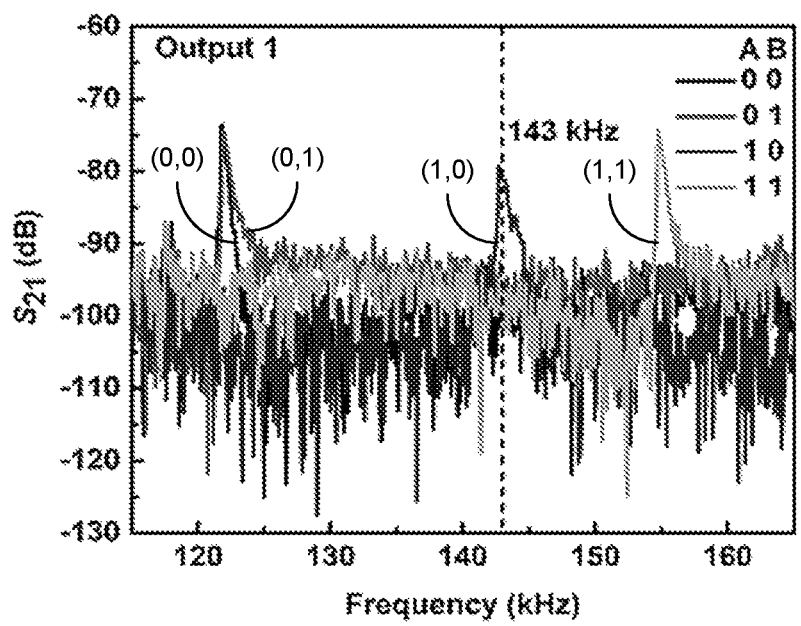
FIG. 10A shows examples of frequency responses at output 1 of FIG. 8B for different logic input conditions, in accordance with various embodiments of the present disclosure.
Figure 10B:
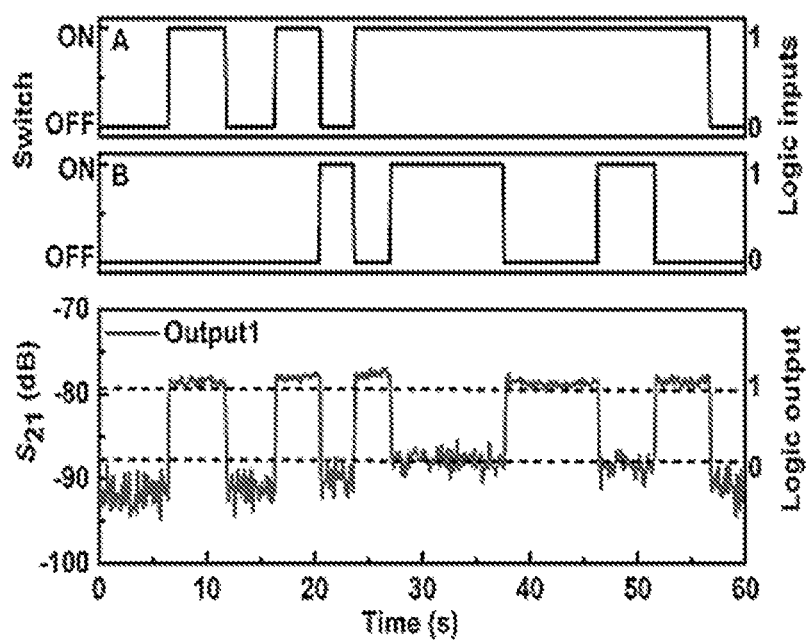
FIG. 10B illustrates a demonstration of Input A "greater than" Input B (A>B) logic function of FIG. 10A at 143 kHz, in accordance with various embodiments of the present disclosure.

The comparator function "Input A 'greater than' Input B" is realized on Res. 1 (output 1) at node 6 of FIG. 8B. Examples of the frequency responses of Res. 1 (output 1) for different logic input conditions are shown in FIG. 10A, where the (1,0) logic input condition has a high $S_{21}$ transmission signal at 143 kHz and the other logic input conditions have a low transmission signal at that point, which can be represented by 1 and 0, respectively. Demonstration of Input A "greater than" Input B (A>B) logic function when the frequency of the AC input signal is chosen to be 143 kHz is shown in FIG. 10B. The two input signals A and B are shown with the input A above the input B, where the switch OFF/ON states correspond to 0/1 input conditions. The $S_{21}$ transmission signal at output 1 corresponds to the logic output and fulfills the comparator function A>B.

The frequency responses of Res. 1 (output 1) due to logic inputs (0,0), (0,1), (1,0), and (1,1) are plotted in FIG. 10A. For both logic inputs (0,0), and (0,1), the voltage source $V_A$ is disconnected from the electrical network responsible for the electrothermal actuation, as shown in FIGS. 9A and 9B, as switch A is in the OFF (0) state for each case. Hence, Res. 1 is on-resonance around 122 kHz, showing low $S_{21}$ transmission signal at $f_{op}=143$ kHz for logic inputs (0,0) and (0,1). For logic input (1,0), the voltage source $V_A$ is connected to the electrical network as illustrated in FIG. 9C, as switch A is in the ON state (1). Res. 1 is now on-resonance at $f_{op}=143$ kHz, hence it shows high $S_{21}$ transmission signal at that point. For logic input (1,1), both voltage sources $V_A$ and $V_B$ are connected to the electrical network as shown in FIG. 9D, since both switches A and B are in the ON state (1). The total current in this case is different than logic input condition (0,1) case ($I'_{R1} \neq I_{R1}$), hence it modulates the resonance frequency of Res. 1 to around 155 kHz, away from $f_{op}=143$ kHz. Output 1 shows high $S_{21}$ transmission signal at $f_{op}=143$ kHz in this case denoting logic output (1). The time response of Res. 1 (output 1) is illustrated in FIG. 10B, which shows the $S_{21}$ transmission signal corresponding to the Input A "greater than" Input B function based on the corresponding binary inputs A and B. It clearly shows that when input A=1 and B=0, the $S_{21}$ transmission signal has logic high (1) indication whereas it is low (0) for all other conditions.

Input A "Less Than" Input B

Figure 11A:
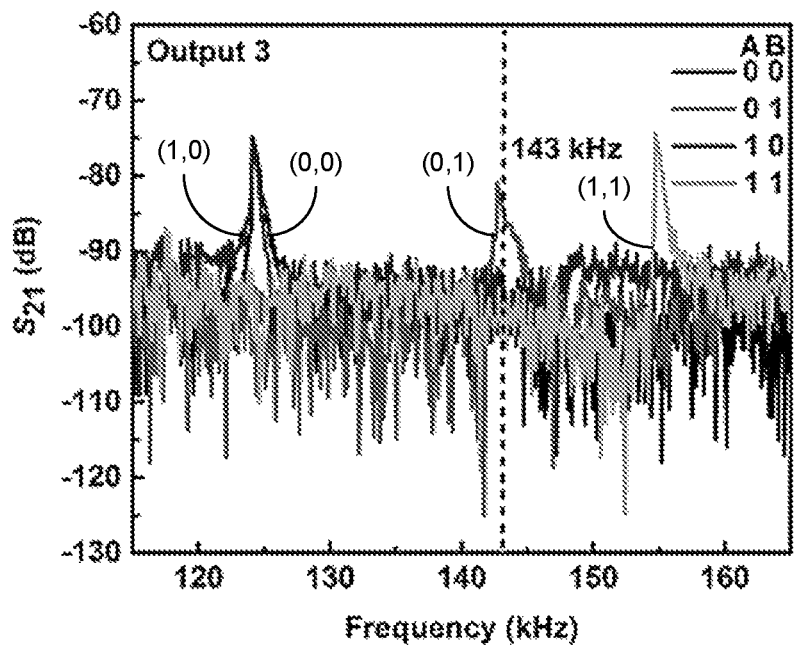
FIG. 11A shows examples of frequency responses at output 3 of FIG. 8B for the different logic input conditions, in accordance with various embodiments of the present disclosure.
Figure 11B:
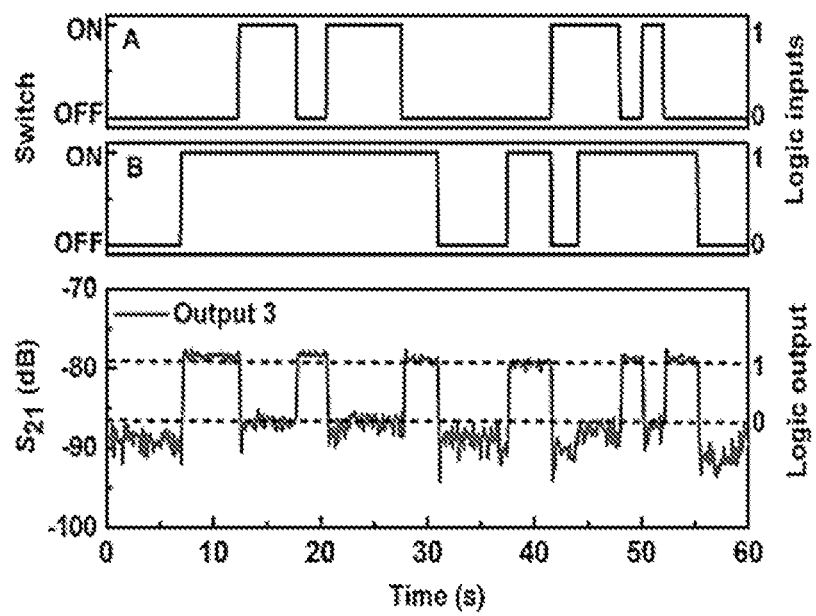
FIG. 11B illustrates a demonstration of Input A "less than" Input B (A<B) logic function of FIG. 11A at 143 kHz, in accordance with various embodiments of the present disclosure.

The comparator function "Input A 'less than' Input B" is realized on Res. 3 (output 3) at node 8 of FIG. 8B. Examples of the frequency responses of Res. 3 from output 3 for different logic input conditions are shown in FIG. 11A, where the (0,1) logic input condition has a high $S_{21}$ signal at 143 kHz and the other logic input conditions have a low transmission signal at that point, which can be represented by 1 and 0, respectively. Demonstration of Input A "less than" Input B (A<B) logic function when the frequency of the AC input signal is chosen to be 143 kHz is shown in FIG. 11B. The two input signals A and B are shown with the input A above the input B, where the switch OFF/ON states correspond to 0/1 input conditions. The $S_{21}$ transmission signal corresponds to the logic output and fulfills the comparator function A<B.

The frequency responses due to logic inputs (0,0), (0,1), (1,0) and (1,1) are plotted in FIG. 11A. For both logic inputs (0,0) and (1,0), the voltage source $V_B$ is disconnected, as shown in FIGS. 9A and 9C where switch B is OFF (0). Hence, Res. 3 vibrates at on-resonance state around 124 kHz, showing a low $S_{21}$ transmission signal at $f_{op}$=143 kHz. For logic input (0,1), the voltage source $V_B$ is connected as shown in FIG. 9B where switch B is ON (1). Res. 3 is now on-resonance at $f_{op}$=143 kHz, hence it shows a high $S_{21}$ transmission signal at this frequency. For logic input (1,1), both voltage sources $V_A$ and $V_B$ are connected to the electrical network as shown in FIG. 9D, since both switches A and B are ON (1). The total current in this case is different than the logic input (1,0) case ($I'_{R3} \neq I_{R3}$), hence it modulates the resonance frequency of Res. 3 to around 155 kHz, away from $f_{op}$=143 kHz. Thus, output 3 shows a low $S_{21}$ transmission signal at $f_{op}$=143 kHz. The time response of Res. 3 (output 3) are depicted in FIG. 11B showing the $S_{21}$ transmission signal corresponding to the Input A "less than" Input B function based on the corresponding binary inputs A and B. It clearly shows that only for input A=0 and B=1 the $S_{21}$ transmission signal has logic high (1), whereas it is low (0) for all other conditions.

Input A "Equal to" Input B

Figure 12A:
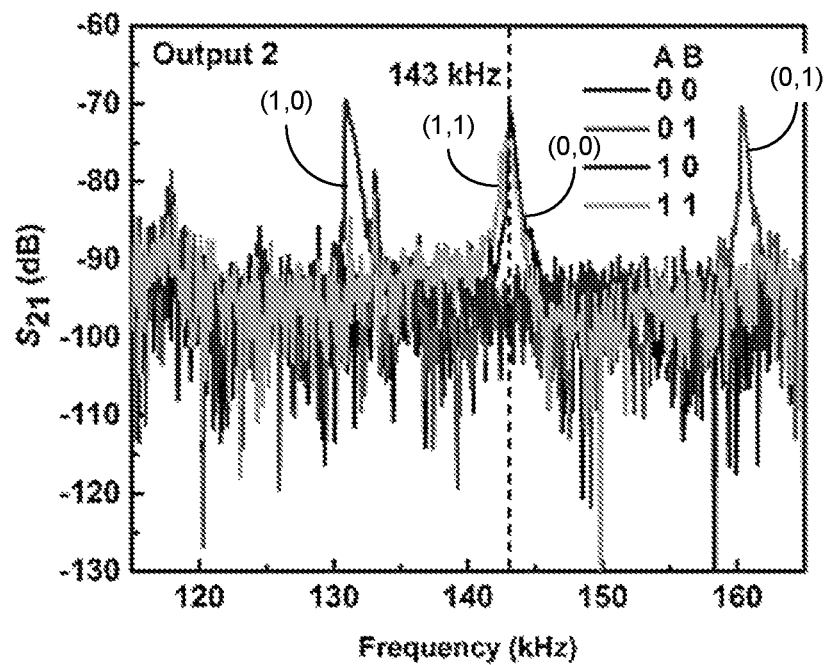
FIG. 12A shows examples of frequency responses at output 2 of FIG. 8B for the different logic input conditions, in accordance with various embodiments of the present disclosure.
Figure 12B:
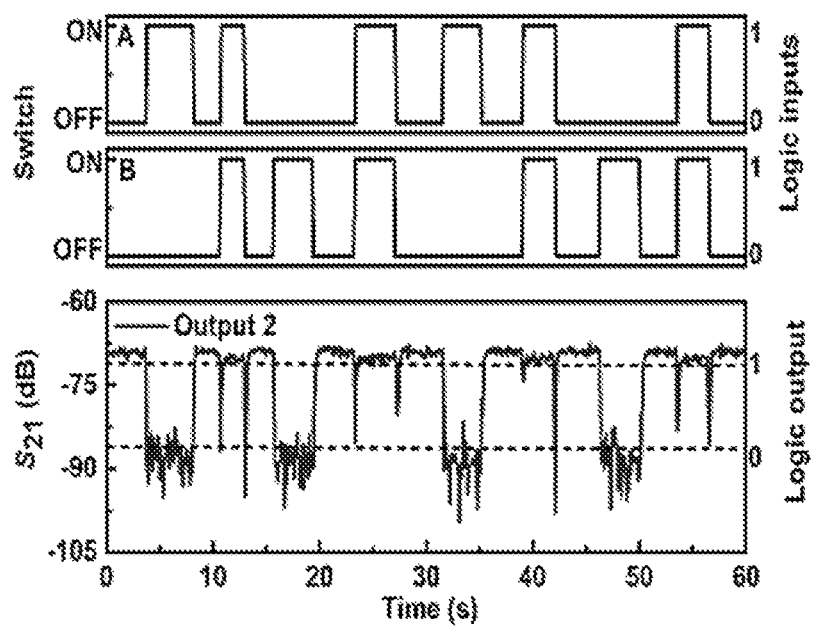
FIG. 12B illustrates a demonstration of Input A "equal to" Input B (A=B) logic function of FIG. 12A at 143 kHz, in accordance with various embodiments of the present disclosure.

The comparator function "Input A 'equal to' Input B" is realized on Res. 2 (output 2) at node 7 of FIG. 8B. Examples of the frequency responses of Res. 2 from output 2 for different logic input conditions are shown in FIG. 12A, where (0,0) and (1,1) logic inputs have high $S_{21}$ transmission signals at 143 kHz and the other logic input conditions have a low transmission signal at that point, which can be represented by 1 and 0, respectively. Demonstration of Input A "equal to" Input B (A=B) logic function when the frequency of the AC input signal is chosen to be 143 kHz is shown in FIG. 12B. The two input signals A and B are shown with the input A above the input B, where the switch OFF/ON states correspond to 0/1 input conditions. The $S_{21}$ transmission signal corresponds to logic output and fulfills the comparator function A=B.

The frequency responses due to logic inputs (0,0), (0,1), (1 0), and (1,1) are plotted in FIG. 12A. For logic input (0,0) the voltage sources $V_A$ and $V_B$ are disconnected as shown in FIG. 9A, where switches A and B are OFF (0). Hence, Res. 2 vibrates at on-resonance state around 143 kHz due to the $I_{R2}$ flowing through Res. 2 due to $V_C$. Res. 2 shows a high $S_{21}$ transmission signal at $f_{op}$=143 kHz. For logic input conditions (0,1), the voltage source $V_B$ is connected to the electrical network as shown in FIG. 9B. The current flowing through Res. 2 in this case is $I'_{R2} \neq I_{R2}$ as switch B is in the ON state (1) only. As a result, Res. 2 is at resonance around 162 kHz; hence off-resonance at $f_{op}$=143 kHz, resulting in a low $S_{21}$ transmission signal at that operating frequency. For logic input condition (1,0), the voltage source $V_A$ is connected to the electrical network as shown in FIG. 9C. The current flowing through Res. 2 in this case is $I''_{R2} \neq I_{R2}$ as switch A is in the ON state (1) only. As a result, Res. 2 is at resonance around 135 kHz; hence off-resonance at $f_{op}$=143 kHz resulting in a low $S_{21}$ transmission signal at that operating frequency. Finally, for logic input (1,1), both voltage sources $V_A$ and $V_B$ are connected as in FIG. 9D, and both switches A and B are in the ON state (1). In this case, the total current flowing through Res. 2 is $I'''_{R2}$. However, due to the assigned polarity of $V_A$ and $V_B$, the resulting current from these voltage sources through Res. 2 cancels each other, hence, $I'''_{R2} \approx I_{R2}$. Thus, output 2 shows a high $S_{21}$ transmission signal at $f_{op}$=143 kHz (in green). FIG. 12B shows the time response of Res. 2 (output 2) showing $S_{21}$ transmission signal corresponding to Input A "equal to" Input B function based on the corresponding binary inputs A and B. It clearly shows that for input A=B=0/1, the $S_{21}$ transmission signal shows logic high (1), whereas it is low (0) for all other conditions.

FIG. 13 includes a truth table summarizing the outputs for the A>B (greater than), A=B (equal to), and A<B (less than) functions. The truth table shows full agreement with that of a 1-bit binary comparator shown in the table of FIG. 8A.

Single-Bit 4-to-2 Encoder

An encoder is a digital device that compresses information for efficient transmission or storage by converting data into a code. In principle, a single-bit 4-to-2 encoder converts 4 input bits into 2 output bits. FIG. 14A shows a block diagram of a single-bit 4-to-2 encoder with the corresponding inputs D1, D2, D3, and D4, and outputs X and Y. The working principle of a 4-to-2 encoder is as follows: the electrical signals are at low level at both outputs X and Y, representing logic output (0 0) for input condition D1=1, D2=0, D3=0, and D4=0. For the case of D1=0, D2=1, D3=0, and D4=0, the output Y is high while the output X is low, representing logic output (0 1). The electrical signal is high at output X and low at output Y, representing the logic output (1 0), for the input case D1=0, D2=0, D3=1, and D4=0. Finally, both outputs X and Y are high, representing logic output (1 1), for input condition D1=0, D2=0, D3=0, and D4=1. The corresponding truth table is provided in FIG. 14A.

FIG. 14B shows a schematic of an example of a configuration for realizing the single-bit 4-to-2 encoder using two electrically connected arch microresonators. Four input bits correspond to four switches, D1, D2, D3 and D4. Switch ON (or OFF) corresponds to input 1 (or 0) for all the switches. Two outputs for the encoder are X and Y. The resonance frequency and micro-beam resistance for these resonators were measured to be about 120 kHz, and 118Ω, respectively. Res. Y and Res. X are placed in between nodes 1 & 2, and 2 & 3, respectively. All the drive electrodes 203 are electrically connected and provided with an AC signal from the output port of the network analyzer (Agilent E5071C) at node 4. The micro-beams are electrically connected in series and biased with a DC voltage source, $V_{DC}$=40V, connected at node 3.

The two outputs, X (at node 6) and Y (at node 5), from the sensing electrodes 215 constitute the encoder output. These output ports can be connected to a low noise amplifier (LNA), one at a time, to amplify the AC current generated due to the in-plane motion of the corresponding micro-beam resonator to measure a $S_{21}$ transmission signal. The high (or low) $S_{21}$ transmission signal sensed at the output ports, X and Y, at the on-resonance (or off-resonance) state is defined as the output 1 (or 0). Four DC voltage sources, $V_{D1}$=0.6V, $V_{D2}$=0.52V, $V_{D3}$=0.52V, and $V_{D4}$=1.04V are suitably connected across the micro-beams with four resistors, $R_{D1}$=$R_{D2}$=$R_{D3}$=$R_{D4}$=50Ω, and the four switches, D1, D2, D3, and D4, respectively. This arrangement then forms the inputs for the proposed encoder where the switch ON (or OFF) condition for each of these switches is defined as input 1 (or 0).

It is worth mentioning that the single-bit 4-to-2 encoder is a common encoder, not a priority encoder. It is active when one of the inputs (D1, D2, D3, and D4) is high (switch ON). Therefore, only four input combinations (1 0 0 0, 0 1 0 0, 0 0 1 0, 0 0 0 1) are possible. It is also worth noting that no matter whether the input D1 is ON (1) or OFF (0), the corresponding encoder output is always (0 0). Note that all the experiments have been conducted at a pressure=1 Torr, temperature=25° C., $V_{AC}$=0 dBm (0.224$V_{rms}$), and $f_{op}$=140 kHz.

FIGS. 15A-15D show examples of electrical circuit diagrams for the electrothermal actuation scheme to implement the single-bit 4-to-2 encoder configurations for the different encoder input conditions. The diagrams show the corresponding DC current flow through the micro-beams for the different encoder input conditions. For an input of (1 0 0 0), the current flowing through Res. X and Res. Y are $I'_X=I'_Y$. For an input of (0 1 0 0), the currents flowing through Res. X and Res. Y are $I_X=0$, and $I_Y$, respectively. For an input of (0 0 1 0), the currents flowing through Res. X and Res. Y are $I_X$, and $I_Y=0$, respectively. For an input of (0 0 0 1), the currents flowing through Res. X and Res. Y are $I_X=I_Y$.

Figure 16A:
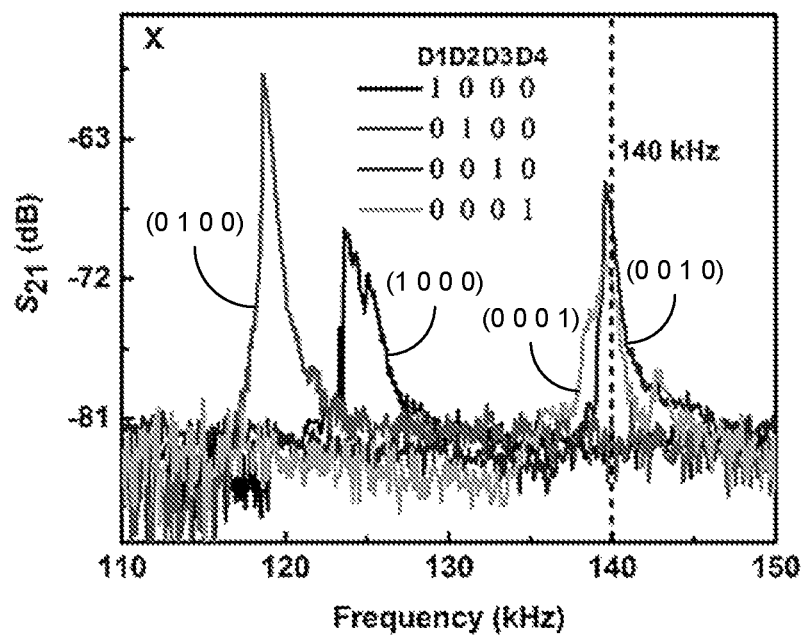
FIGS. 16A and 16B show examples of frequency responses at outputs X and Y of FIG. 14B for the different logic input conditions, in accordance with various embodiments of the present disclosure.
Figure 16B:
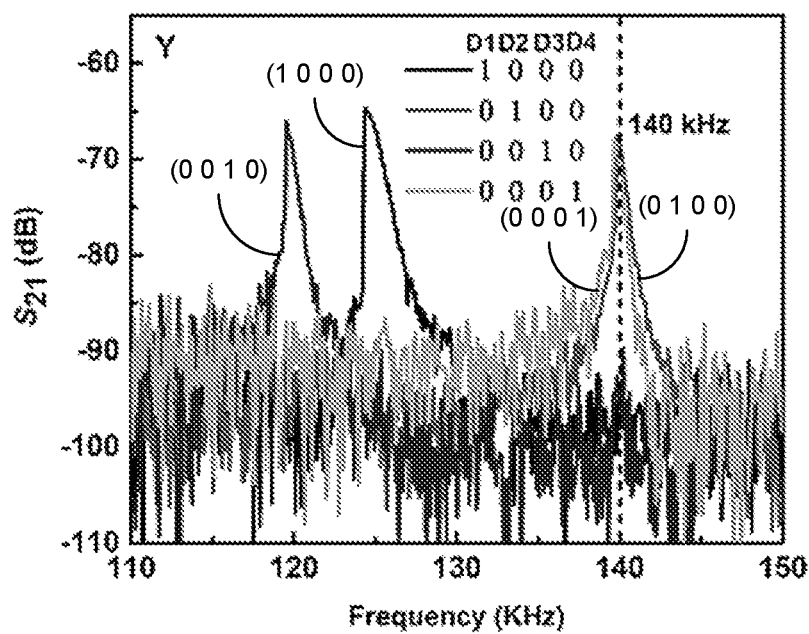

The frequency responses of the microresonators (Res. X and Res. Y) sensed at output X and output Y for the four different encoder inputs (1 0 0 0), (0 1 0 0), (0 0 1 0), and (0 0 0 1) are shown in FIGS. 16A and 16B, respectively. For the encoder input (1 0 0 0), the DC current flow through Res. X and Res. Y is $I'_X=I'_Y$ as shown in FIG. 15A. Due to the choice of the voltage load, $V_{D1}=0.6V$, both resonators are at on-resonance state around 125 kHz, but importantly, at the off-resonance state at $f_{op}=140$ kHz. Hence, both outputs X and Y will show a low $S_{21}$ transmission signal, representing the encoder output (0 0). For the encoder input (0 1 0 0), the DC currents through Res. X and Res. Y are $I_X=0$, and $I_Y$, respectively, as shown in FIG. 15B. In this case, Res. Y is at the on-resonance state at 140 kHz, as shown in FIG. 16B while Res. X is at the on-resonance state at 120 kHz, as shown in FIG. 16A. Hence, for this encoder input, the output X is (0) and the output Y is (1) at $f_{op}=140$ kHz, representing an encoder output (0 1).

For the encoder input (0 0 1 0), the DC currents flowing through Res. X and Res. Y are $I_X$, and $I_Y=0$, respectively, as shown in FIG. 15C. In this case, Res. X is at the on-resonance state at $f_{op}=140$ kHz, as shown in FIG. 16A, while Res. Y is at the on-resonance state at 120 kHz, as shown in FIG. 16B. Thus, output X is (1) and output Y is (0) at $f_{op}=140$ kHz, representing the encoder output (1 0). Finally, for the encoder input (0 0 0 1), the DC current flows through Res. X and Res. Y are $I_X=I_Y$, as shown in FIG. 15D. Due to the DC voltage, $V_{D4}=1.04V$, both Res. X and Res. Y are at the on-resonance state at 140 kHz, as shown in FIGS. 16A and 16B, respectively. Hence, it will produce the encoder output (1 1) at $f_{op}=140$ kHz.

Figure 17A:
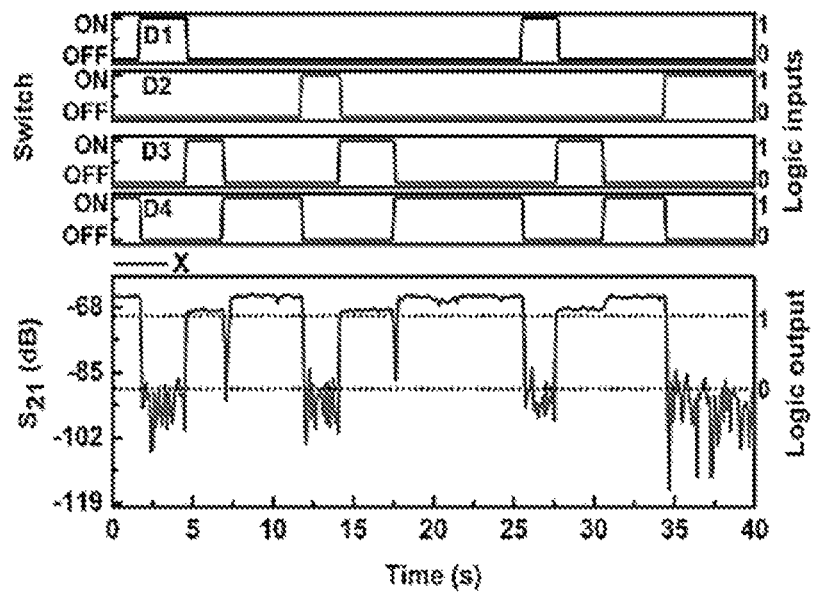
FIGS. 17A and 17B illustrate demonstrations of the X and Y outputs of FIGS. 16A and 16B respectively, in accordance with various embodiments of the present disclosure.
Figure 17B:
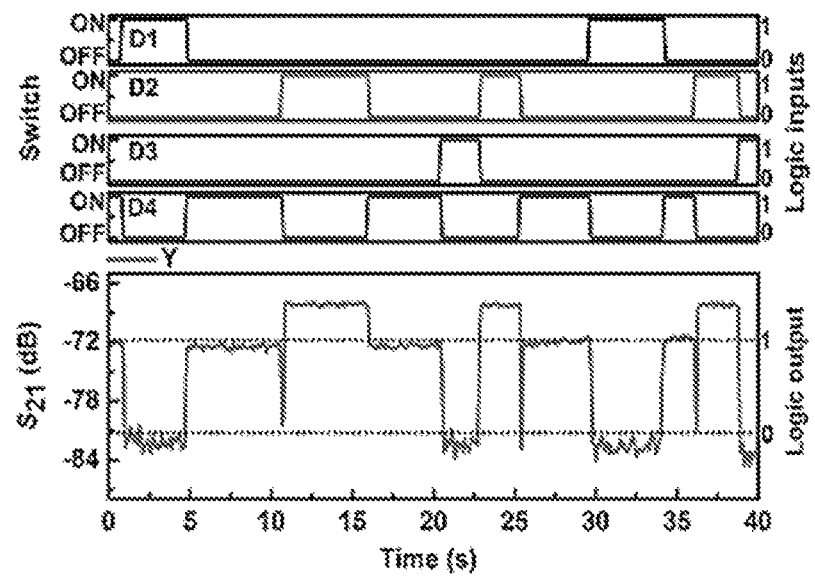

The time responses of the microresonators sensed at output X and output Y are shown in FIGS. 17A and 17B, respectively. The input signals (D1, D2, D3, and D4) are plotted as switches and their high (1) and low (0) levels are represented by the ON and OFF conditions, respectively. The $S_{21}$ transmission signal at output X is plotted in FIG. 17A. The high (1) level can be defined at −70 dB and the low level is defined at −88 dB. For logic inputs (0 0 1 0) or (0 0 0 1), switch D3 or D4 is ON. For each of these conditions Res. X is at the on-resonance state at 140 kHz and shows a high (1) $S_{21}$ transmission signal. Similarly, for logic inputs (0 1 0 0) or (0 0 0 1), switch D2 or D4 is ON, the resulting $S_{21}$ transmission signal at output Y is plotted as illustrated in FIG. 17B. The high (1) level can be defined at −72 dB and the low level is defined at −82 dB.

Note that for output X, the signal levels are the same for logic (0) but slightly different for logic (1) for different encoder inputs. This may be attributed to the different amplitude levels of the responses of the microresonators for different inputs. A similar explanation is applicable for output Y. However, for a correct threshold value defined for the logic output levels (1 or 0), the micro-beam circuit performs the desired logic operations of a single-bit 4-to-2 encoder successfully. The truth table in FIG. 18 shows full agreement with that of a single-bit 4-to-2 encoder outputs shown in the table of FIG. 14A.

In summary, an alternative approach to construct complex logic circuits has been demonstrated, where the logic functions are executed through reconfiguring the electrothermal actuation circuits of multiple resonators. Several essential computing elements have been demonstrated, which depend on complex logic operations, based on a conceptual framework of electrothermal frequency tuning. The standard electrostatic transduction technique and the CMOS friendly fabrication techniques used in this work naturally allow the systems to be compact and integrated on-chip. The demonstration of complex logic elements based on this conceptual framework may be used to implement an electromechanical microcomputer.

Ratios, concentrations, amounts, and other numerical data may be expressed in a range format. It is to be understood that such a range format is used for convenience and brevity, and should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant Fig. of the numerical value. In addition, the phrase "about 'x' to 'y'" includes "about 'x' to about 'y'".

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

Therefore, the following is claimed:

1. A reprogrammable logic device, comprising:
    an oscillator/resonator comprising a drive electrode, a sense electrode, and a micro-beam extending between the drive electrode and the sense electrode, wherein first and second ends of the micro-beam are connected to corresponding first and second beam electrodes, and wherein a tunable AC signal is applied as an input to the drive electrode of the oscillator/resonator;
    a first logic input and a second logic input, each electrically and directly connected to the first and second beam electrodes of the oscillator/resonator, the first and second logic inputs each including a DC voltage source, and an on/off switch; and
    the oscillator/resonator including an output terminal electrically coupled to the sense electrode.

2. The reprogrammable logic device of claim 1, wherein actuation of the oscillator/resonator is selected from the group of electro-thermal, electrostatic, and photo-thermal actuation.

3. The reprogrammable logic device of claim 1, having series and parallel resonance peaks as measured at the output terminal, and wherein switching at least one of the first and second logic inputs on or off causes a shift in a series resonance peak or a shift in a parallel resonance peak or both.

4. The reprogrammable logic device of claim 1, wherein switching one or both of the first and second logic inputs on or off provides logic gate operation.

5. The tunable oscillator/resonator of claim 1, wherein the oscillator/resonator is a clamped-clamped arch-shaped beam device or a clamped-clamped straight beam device.

6. The tunable oscillator/resonator of claim 1, wherein the output terminal of the oscillator/resonator is electrically connected to a capacitor.

7. The reprogrammable logic device of claim 1, wherein switching of one or both of the first and second logic inputs on or off provides AND, NAND, OR, NOR, XOR, XNOR or NOT gate logic, or any combination thereof.

8. The reprogrammable logic device of claim 1, further including a third logic input provided to the oscillator/resonator by a DC voltage source separate from both of the first and second logic inputs, the third logic switch including an on/off switch.

9. The reprogrammable logic device of claim 8, wherein switching of the logic inputs on or off provides AND, NAND, OR or NOR gate logic, or any combination thereof.

10. A method of providing logic gate operation, the method comprising:
providing a tunable oscillator/resonator, the oscillator/resonator including a drive electrode, a sense electrode, and a micro-beam that extends between the drive electrode and the sense electrode, wherein first and second ends of the micro-beam are connected to corresponding first and second beam electrodes, a tunable AC signal is coupled as an input to the drive electrode, a first logic input and a second logic input, each of the first and second logic inputs being electrically and directly connected to the first and second beam electrodes, and each of the first and second logic inputs including a DC voltage source and an on/off switch, and an output terminal connected to the sense electrode; and
switching at least one of the first and second logic inputs on or off, wherein switching one or both of the first and second inputs on or off provides logic gate operation.

11. The method of claim 10, including the step of choosing an AC driving frequency in association with the switching of at least one of the logic inputs on or off.

12. The method of claim 10, wherein the tunable oscillator/resonator has series and parallel resonance peaks as measured at the output terminal, and wherein switching at least one of the first and second logic inputs on or off causes a shift in a series resonance peak or a shift in a parallel resonance peak or both.

13. The method of claim 12, wherein the first and second logic inputs are provided by separate DC voltage sources, either the voltage level of the first logic input or the second logic input, or both, selected to cause the shift in the series resonance peak or the parallel resonance peak or both.

14. The method of claim 10, wherein the tunable oscillator/resonator is a clamped-clamped arch-shaped beam device or a clamped-clamped straight beam device.

15. The method of claim 10, wherein the output terminal of the tunable oscillator/resonator is coupled to a capacitor.

16. The method of claim 10, wherein the oscillator/resonator operates in a linear regime.

17. The method of claim 10, wherein the oscillator/resonator operates at room temperature and at a pressure in the range of 1 Torr to 10 Torr.

18. The method of claim 10, wherein switching of one or both of the first and second inputs on or off provides AND, NAND, OR, NOR, XOR, XNOR, or NOT gate logic, or any combination thereof.

19. The method of claim 10, wherein the oscillator/resonator further includes a third logic input provided to the oscillator/resonator by a DC voltage source separate from both of the first and second logic inputs, the third logic switch including an on/off switch.

20. The method of claim 19, wherein the switching of one or more of the logic inputs provides AND, NAND, OR or NOR gate logic, or any combination thereof.

* * * * *